United States Patent [19]
Ikeda et al.

[11] Patent Number: 6,009,259
[45] Date of Patent: Dec. 28, 1999

[54] EMULATION SYSTEM

[75] Inventors: Tomoaki Ikeda; Kazuhiko Yawata, both of Hyogo, Japan

[73] Assignee: Mitsubishi Electric Micro-Computer Application Software Co., Ltd., Hyogo, Japan

[21] Appl. No.: 08/821,941

[22] Filed: Mar. 21, 1997

[51] Int. Cl.[6] .............................. G06F 9/455; G06F 17/00
[52] U.S. Cl. ................................ 395/500.44; 395/500.45; 395/500.46; 395/500.47
[58] Field of Search .............................. 364/578; 395/500

[56] References Cited

U.S. PATENT DOCUMENTS

| | | | |
|---|---|---|---|
| 5,477,475 | 12/1995 | Sample et al. | 364/578 |
| 5,541,862 | 7/1996 | Bright et al. | 364/580 |
| 5,604,888 | 2/1997 | Kiani-Shabestari et al. | 395/500 |
| 5,699,283 | 12/1997 | Okazaki et al. | 364/578 |
| 5,748,875 | 5/1998 | Tzori | 395/183.05 |
| 5,754,827 | 5/1998 | Barbier et al. | 395/500 |

*Primary Examiner*—Kevin J. Teska
*Assistant Examiner*—Samuel Broda
*Attorney, Agent, or Firm*—McDermott, Will & Emery

[57] ABSTRACT

IC 5 for exclusive use in wiring control has been used in conventional emulation system which is difficult in coping with various types of logic verification and results in high cost. An emulation system according to the invention comprises: a digital input terminal section 8 to which a digital signal is inputted; a plurality of field programmable gate arrays 1 to 4 for verifying logic of the inputted signal; a digital output terminal section 9 for outputting a signal of which logic has been verified; a wiring control selector section 7 which is connected to the digital input terminal section 8 and to the digital output terminal section 9; and an analog universal region 6 which is connected to said wiring control selector section 7; thereby carrying out wiring control between the wiring control selector section and the plurality of field programmable gate arrays, and wiring control among the plurality of field programmable gate arrays.

24 Claims, 19 Drawing Sheets

EMULATION SYSTEM

BACKGROUND OF THE INVENTION

1. Industrial Field

The present invention relates to an emulation system used for logic verification, algorithm analysis, etc. by actual machine in the designing stage of an application specific integrated circuit (hereinafter referred to as "ASIC") under development.

2. Prior Art

Hitherto, in the development of ASIC, logic verification using any general purpose substrate and logic verification using a substrate prepared for exclusive use of ASIC have been carried out on an ASIC which is same as the one designed in EWS system. With the recent progress of semiconductor technology, it has been certainly possible to develop a large scale ASIC, but it takes a very long time to prepare such a large scale ASIC by manually applying a required wiring to a substrate. In case of the substrate for exclusive use of ASIC, since there is no versatility, it has been necessary to prepare a substrate every time an ASIC is developed.

To cope with the mentioned disadvantages, an emulation system has been introduced and, at present, logic verification in the development of ASIC may be smoothly carried out by actual machine.

FIG. 19 is a block diagram showing essential parts of a conventional emulation system. In the drawing, reference numerals 1 to 4 indicates FPGA(s) for emulation of field programmable gate array each serving as an integrated circuit of the programmable gate array to carry out logic verification (hereinafter referred to as "emulation FPGA(s)"), and numeral 5 indicates an IC for exclusive use in wiring control using a gate array (hereinafter referred to as "wiring control IC").

Operation of this conventional emulation system is hereinafter described.

Every input/output pin of the emulation FPGA 1 to 4 for carrying out logic verification is connected to the wiring control IC 5. For carrying out logic verification, a signal line is selected from among the input/output pins connected to the wiring control IC 5, then logic verification is carried out in the emulation FPGA 1 to 4, and a signal is outputted through the wiring control IC 5.

As mentioned above, the conventional emulation system of above arrangement is essentially provided with the IC 5 for exclusive use in wiring control, resulting in an emulation system of high cost. There is also another type of emulation system in which wiring control is carried out by utilizing a part of the emulation FPGA(s) 1 to 4. This another type of emulation system, however, has a disadvantage of reducing number of gates for carrying out logic verification due to such wiring control to which a part of emulation FPGA(s) is directed.

A further problemincidental to the conventional emulation system exists in that input signal for carrying out logic verification and output signal outputted after carrying out logic verification are all digital signals, and therefore it is necessary to prepare an analog circuit employing a separate substrate for carrying out logic verification on analog signal.

SUMMARY OF THE INVENTION

The present invention was made to solve the above-discussed problems, and a primary object of the invention is to provide an emulation system capable of carrying out any verification smoothly by actual machine, without any IC for exclusive use in wiring control and without reducing number of gates to be directed to logic verification.

Another object of the invention is to provide an emulation system of which performance is improved so as to be capable of carrying out various types of logic verification including logic verification on analog signal.

A further object of the invention is to provide an emulation system which is provided with terminals for exclusive use in analog signals of image, sound, etc. so that logic verification on the analog signals is easily carried out.

A still further object of the invention is to provide an emulation system of which logic verification performance is improved by incorporating IC such as multipliers, RAM, etc.

A yet further object of the invention is to provide an emulation system capable of carrying out conversion between serial and parallel.

A further object of the invention is to provide an emulation unit which may be used by coupling a plurality of emulation systems in the event that circuit scale for carrying out logic verification is enlarged.

In order to accomplish the foregoing objects, an emulation system according to the invention comprises: a digital input terminal section to which a digital signal is inputted; a plurality of field programmable gate arrays for verifying logic of the signal inputted to said digital input terminal section; a digital output terminal section for outputting a signal of which logic has been verified by said field programmable gate arrays; a wiring control selector section which is connected to said digital input terminal section and to said digital output terminal section for carrying out wiring control between the wiring control selector section and the plurality of field programmable gate arrays, and wiring control among the plurality of field programmable gate arrays; and an analog universal region which is connected to said wiring control selector section and in which a circuit for conversion between an analog signal and a desired signal may be disposed.

It is preferable that the emulation system comprises an analog input/output terminal section for carrying out either input or output of the analog signal to or from said analog universal region or both of the input and output.

It is preferable that said analog input/output terminal section is provided with either an image signal terminal or a sound signal terminal or both of the image signal terminal and sound signal terminal.

It is preferable that the emulation system comprises input selecting means for selecting whether an input signal inputted to said wiring control selector section comes from said digital output terminal section or from said analog universal region.

It is preferable that the emulation system comprises output selecting means for selecting whether an output signal from said wiring control selector section is outputted from said digital output terminal section or from said analog universal region.

It is preferable that said wiring control selector section has either a function for selecting whether an input signal comes from said digital input terminal section or from said analog universal region or a function for selecting whether an output signal is outputted from said digital output section or from said analog universal region or both of said two functions.

It is preferable that the emulation system comprises a digital universal region in which a digital external circuit may be inserted so that the external circuit is also used in logic verification carried out by said plurality of field programmable gate arrays.

It is preferable that said wiring control selector section may input and output said signal between the wiring control selector section and said plurality of field programmable gate arrays by plural bits.

It is preferable that said wiring control selector section may input and output the signal for each block forming an internal circuit of each field programmable gate array.

It is preferable that the emulation system comprises a wiring switch disposed on either a signal input from said digital input terminal section to said plurality of field programmable gate arrays or a signal output from said plurality of field programmable gate arrays to said digital output terminal section or on both of the signal input and signal output, whereby the emulation system is capable of selecting either a signal path passing through said wiring switch or a signal path not passing through said wiring switch.

It is preferable that the emulation system comprises a wiring switch disposed among said plurality of field programmable gate arrays, whereby the emulation system is capable of selecting either a signal path passing through said wiring switch or a signal path not passing through said wiring switch.

It is preferable that said wiring control selector section is provided with a wiring control switch group capable of switching the wiring of the wiring control selector section by changing a set value.

It is preferable that said wiring control selector section is provided with delay means for generating a signal delayed for a certain time as a signal of the selected signal path, whereby either a signal delayed by said delay means or a signal not delayed by said delay means may be selected by changing setting of said wiring control switch group.

It is preferable that each field programmable gate array is provided with an input pin to which a plurality of signal lines for inputting signals may be connected, and selection of a signal line among those signal lines may be carried out by changing setting of said wiring control switch group.

It is preferable that said selection of a signal line among the plurality of signal lines is carried out by increasing impedance of the signal lines not selected to be high.

It is preferable that the emulation system comprises a clock input terminal for inputting a clock signal and a clock output terminal for outputting the clock signal.

It is preferable that said clock input terminal uses one of terminals of said digital input terminal section, and said clock output terminal uses one of terminals of said digital output terminal section, respectively.

It is preferable that the emulation system comprises a clock buffer having a predetermined number of stages for distributing a clock signal and supplying the clock signal to each internal circuit.

It is preferable that said wiring control selector section may change at least one of said field programmable gate arrays to be of different type by controlling the wiring.

It is preferable that selection of either a signal path formed by passing through a first time division circuit inserted in a circuit for connection from said wiring control selector section to said plurality of field programmable gate arrays and a second time division circuit inserted in a circuit for connection from said plurality of field programmable gate arrays to said wiring control selector section or a signal path not passing through the first and second time division circuits, is carried out by wiring control of said wiring control selector section.

It is preferable that said first time division circuit converts a serial signal to a parallel signal, and said second time division circuit converts a parallel signal to a serial signal.

It is preferable that said first time division circuit converts a parallel signal to a serial signal, and said second time division circuit converts a serial signal to a parallel signal.

It is preferable that the emulation system comprises an EXT terminal section for inputting a signal directly to each field programmable gate array.

It is preferable that an emulation unit is formed by coupling a plurality of emulation systems, in which digital input terminal sections and digital output terminal sections of respective emulation systems are arranged in the same manner as each other, and the output terminal section of the first emulation system is connected to the input terminal section of the second emulation system.

Other objects, features and advantages of the invention will become apparent in the course of the following description with reference to the accompanying drawings.

DESCRIPTION OF THE PREFERRED EMBODIMENTS

EXAMPLE 1

Figure 1:
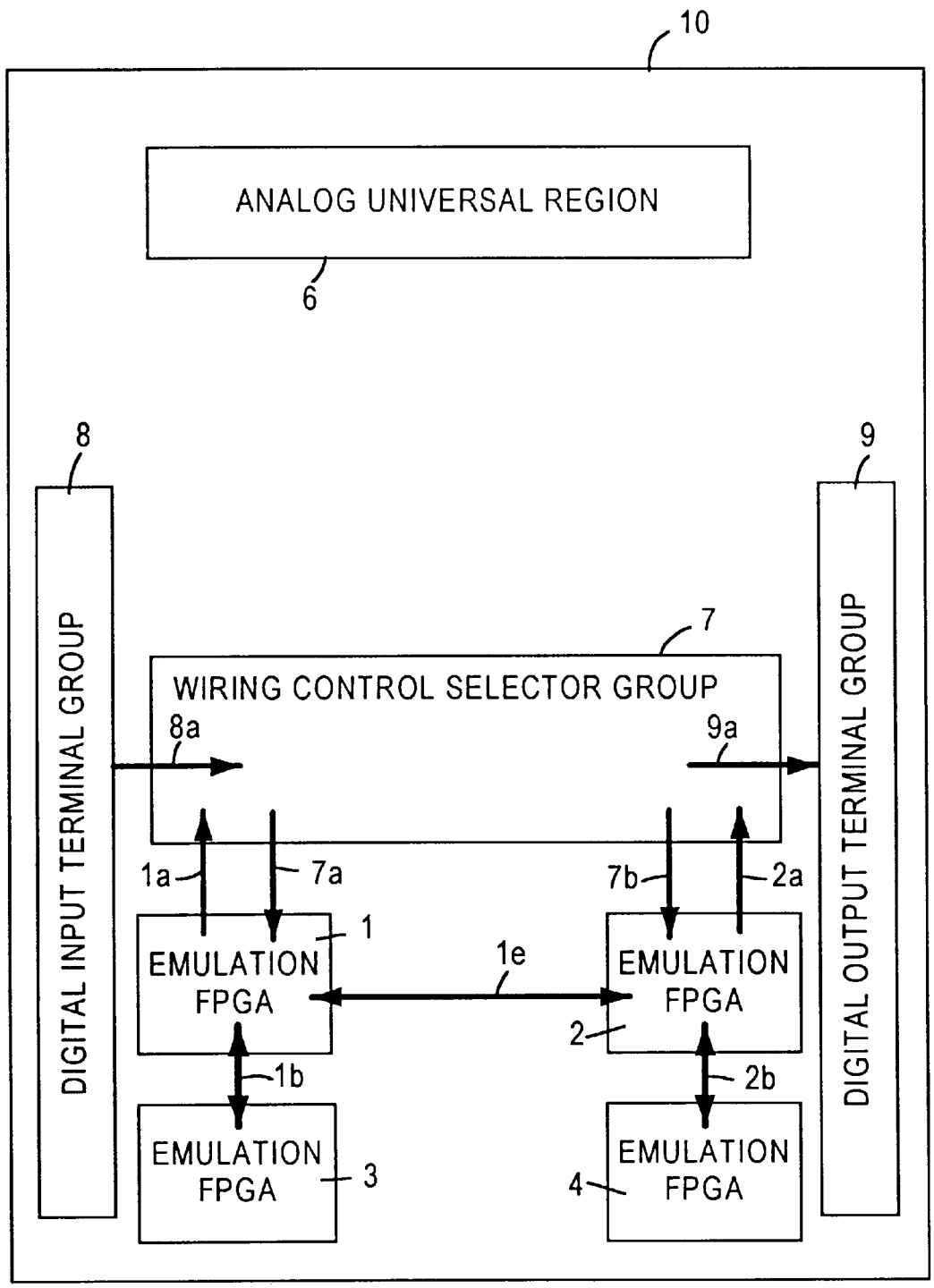
FIG. 1 is a schematic block diagram showing an emulation system according to example 1 of the present invention.

FIG. 1 is a block diagram showing an emulation system according to example 1 of the present invention. In the drawing, reference numerals 1 to 4 designate emulation FPGA(s) arranged in the same manner as those of the conventional system; numeral 6 designates an analog universal region capable of converting an analog signal inputted from any external equipment to a desired signal by involving an existing circuit, and capable of outputting a signal processed by the emulation FPGA(s) 1 to 4 to the external equipment; numeral 7 is a wiring control selector group using field programmable gate arrays for carrying out wiring control between the wiring control selector group and the emulation FPGA(s) 1 to 4 and wiring control among the emulation FPGA(s) 1 to 4 one another; and numeral 8 is a digital input terminal group for inputting a signal from the external circuit to the emulation FPGA(s) 1 to 4, and which is connected to the wiring control selector group 7. Numeral 9 is a digital output terminal group for outputting a signal processed by the emulation FPGA(s) 1 to 4, and which is connected to the wiring control selector group 7. Numeral 10 is an emulation system.

The wiring control selector group 7 has a function of selecting an input from the digital input terminal group 8 and the analog universal region 6 and another function of selecting an output from the digital output terminal group 9 and the analog universal region 6.

Numerals 1a, 2a, 7a, 7b, 8a and 9a designate signals passing through the wiring control selector group 7, and numerals 1b, 1c and 2b designate connections respectively between the emulation FPGA(s) 1 and 3, between the emulation FPGA(s) 1 and 2, and between the emulation FPGA(s) 2 and 4.

Figure 2:
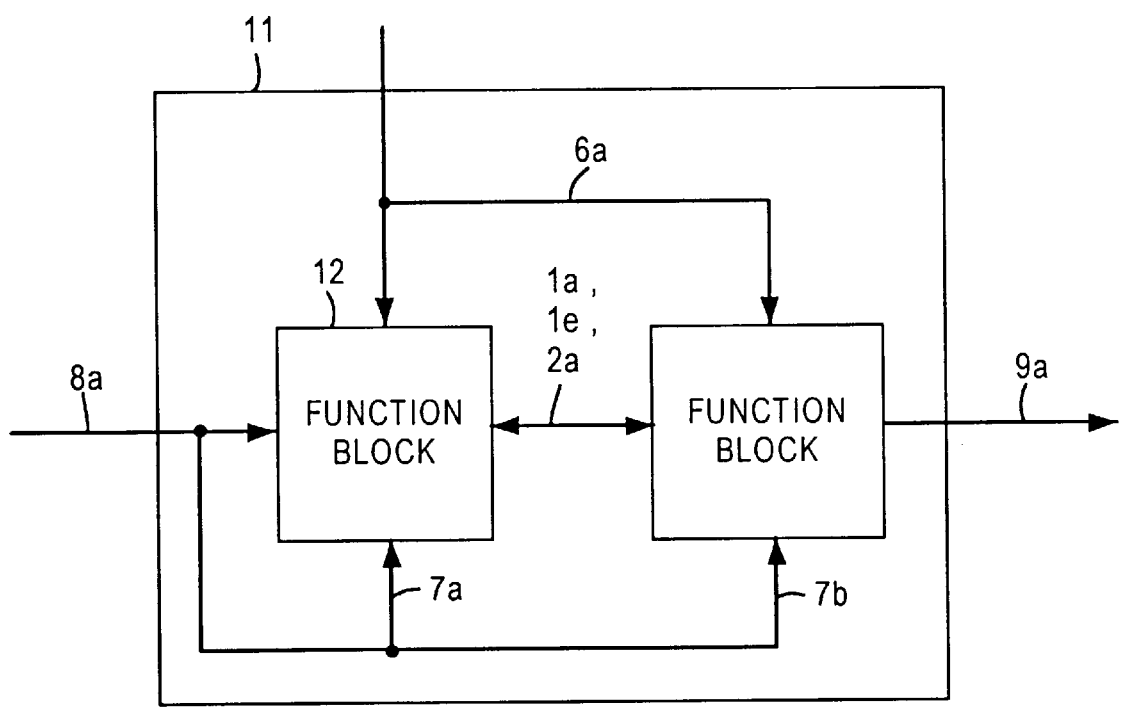
FIG. 2 is a schematic block diagram of a circuit in which ASIC is arranged.

FIG. 2 is a schematic block diagram of a circuit in which ASIC is arranged. In the drawing, numeral 11 designates an ASIC to be actually developed and numerals 12 and 13 designate function blocks inside the ASIC 11. Numeral 6a is a signal outputted from the analog universal region 6 in FIG. 1.

Operation of the circuit is hereinafter described.

In FIG. 1, when a signal is transmitted and received among the emulation FPGA(s) 1 to 4, it is possible to select whether the connection 1e directly connecting the FPGA(s) is to be used or the signals 7a, 1a, 7b and 2a passing through the wiring control selector group 7 are to be used, by changing internal connection of the wiring control selector group 7.

It is also possible, in the emulation FPGA(s) 1 to 4, to verify logic of any desired signal obtained by signal conversion (such as a/d conversion) carried out by the analog universal region 6 through the wiring control selector group 7.

FIG. 2 shows a block diagram of internal part of an ASIC to be actually developed. Described hereinafter is how to evaluate the ASIC by means of the emulation system 10 shown in FIG. 1.

The input signal 8a in FIG. 2 being a digital signal supplied from an external circuit to the ASIC 11 corresponds to the signal 8a inputted from the digital input terminal group 8 to the wiring control selector group 7 in FIG. 1. The signal 6a in FIG. 2 supplied to the ASIC 11 corresponds to the signal 6a outputted from the analog universal region 6 in FIG. 6.

The output signal 9a also corresponds to the signal 9a in FIG. 1.

The function block 12 inside the ASIC 11 shown in FIG. 2 is developed in the emulation FPGA 1 shown in FIG. 1, and the function block 13 inside the ASIC 11 is developed in the emulation FPGA 2 shown in FIG. 1. Any circuit not being able to be developed in the emulation FPGA(s) 1 and 2 due to gate scale, etc. is enlarged and developed in the emulation FPGA(s) 3 and 4 through the connections 1b and 2b.

The connection between the function blocks 12 and 13 inside the ASIC 11 is enlarged and developed in the signals 7a and 7b from the wiring control selector group 7.

As described above, in this example 1, what is equivalent to the circuit including the ASIC 11 shown in FIG. 2 is achieved by the emulation system 10 shown in FIG. 1.

EXAMPLE 2

Figure 3:
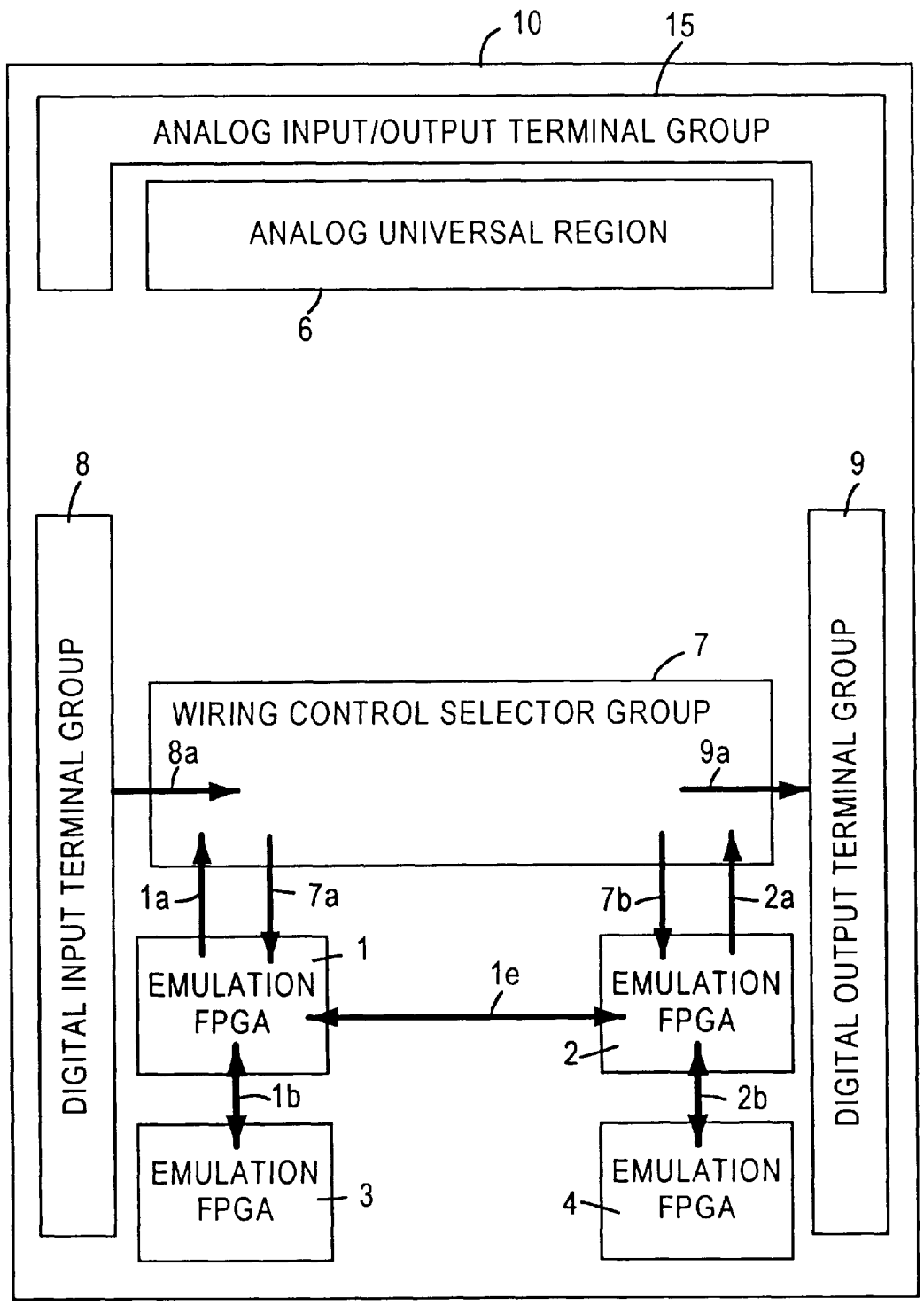
FIG. 3 is a schematic block diagram showing an emulation system according to example 2 of the invention.

FIG. 3 is a schematic block diagram showing an emulation system according to example 2 of the invention. In the drawing, reference numeral 15 designates an analog input/output terminal group.

Operation of this emulation system is hereinafter described.

The signal inputted from external equipment is converted to a desired signal in the analog universal region 6, and in which the analog input/output terminal group 15 is provided with general purpose terminals as input means to be used for analog signals of image, sound, etc., thereby enabling connection to various equipment. The same arrangement is also employed as output means.

The remaining arrangement is same as the foregoing example 1, and repetition of the description is omitted herein.

In the emulation system of above arrangement, since various input/output means are prepared for the signals of image, sound, etc., when logic verification is carried out by a user with the emulation system, the user may input the signal directly from external equipment. Furthermore, since the signal on which logic verification has been carried out may be outputted directly to an external equipment, the signal of which logic verification has been carried out in the emulation system may be acknowledged by the external equipment.

EXAMPLE 3

Figure 4:
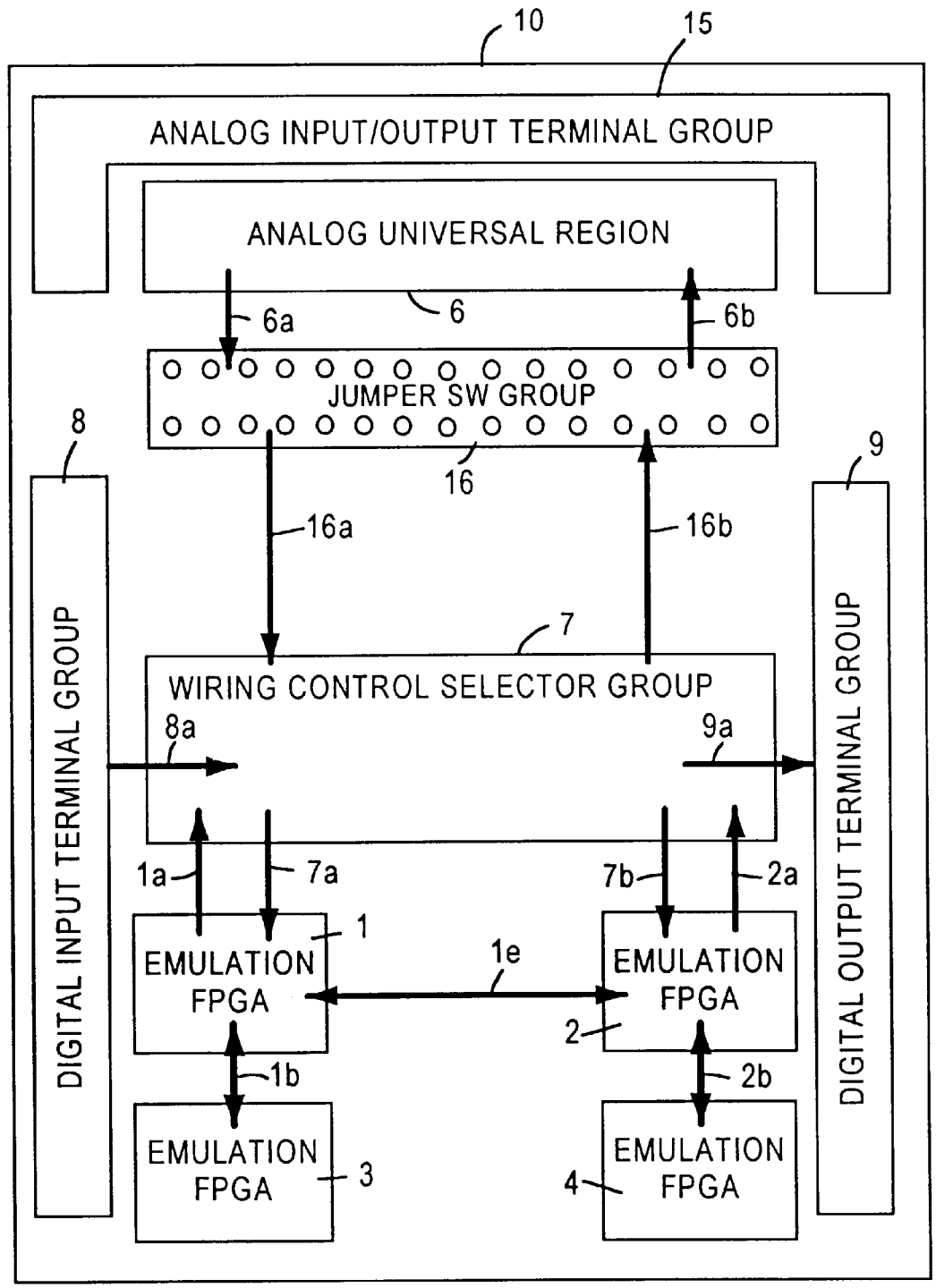
FIG. 4 is a schematic block diagram showing an emulation system according to example 3 of the invention.

FIG. 4 is a schematic block diagram showing an emulation system according to example 3 of the invention.

In the drawing, reference numeral 16 designates a jumper SW group capable of being controlled by taking out and putting in.

Operation of this emulation system is hereinafter described.

A part of the jumper SW group 16 is connected to the input terminal of the wiring control selector group 7 and to the digital input terminal group 8. The other part of the jumper SW group 16 is connected to a terminal for outputting the signal converted to a desired signal (such as a/d converted signal) by the analog universal region 6.

By using the jumper SW group 16 of less internal resistance and connecting the jumper SW group 16 to the digital input terminal group 8, the signal 16a inputted to the wiring control selector group 7 becomes a signal 6a converted in the analog universal region 6 when the jumper SW group 16 is inserted, while the signal inputted to the wiring control selector group 7 becomes a signal 8*a* inputted from the digital input terminal group 8 when the jumper SW group 16 is not inserted. Like operation takes place also in the output terminal.

As a result of connecting a part of the jumper SW group 16 to the input terminal of the wiring control selector group 7 and to the digital input terminal group 8, number of pins of the wiring control selector group 7 may be reduced.

The remaining arrangement is same as the foregoing example 2, and repetition of the description is omitted herein.

In the emulation system of above arrangement, since either the signal from the analog universal region 6 or the digital signal inputted from outside may be selected, it is not necessary for the signal converted in the analog universal region 6 to be connected to the wiring control selector group 7 and, furthermore, the system may cope with various types of input/output means by selecting insert or no-insert of the jumper SW group 16.

EXAMPLE 4

Figure 5:
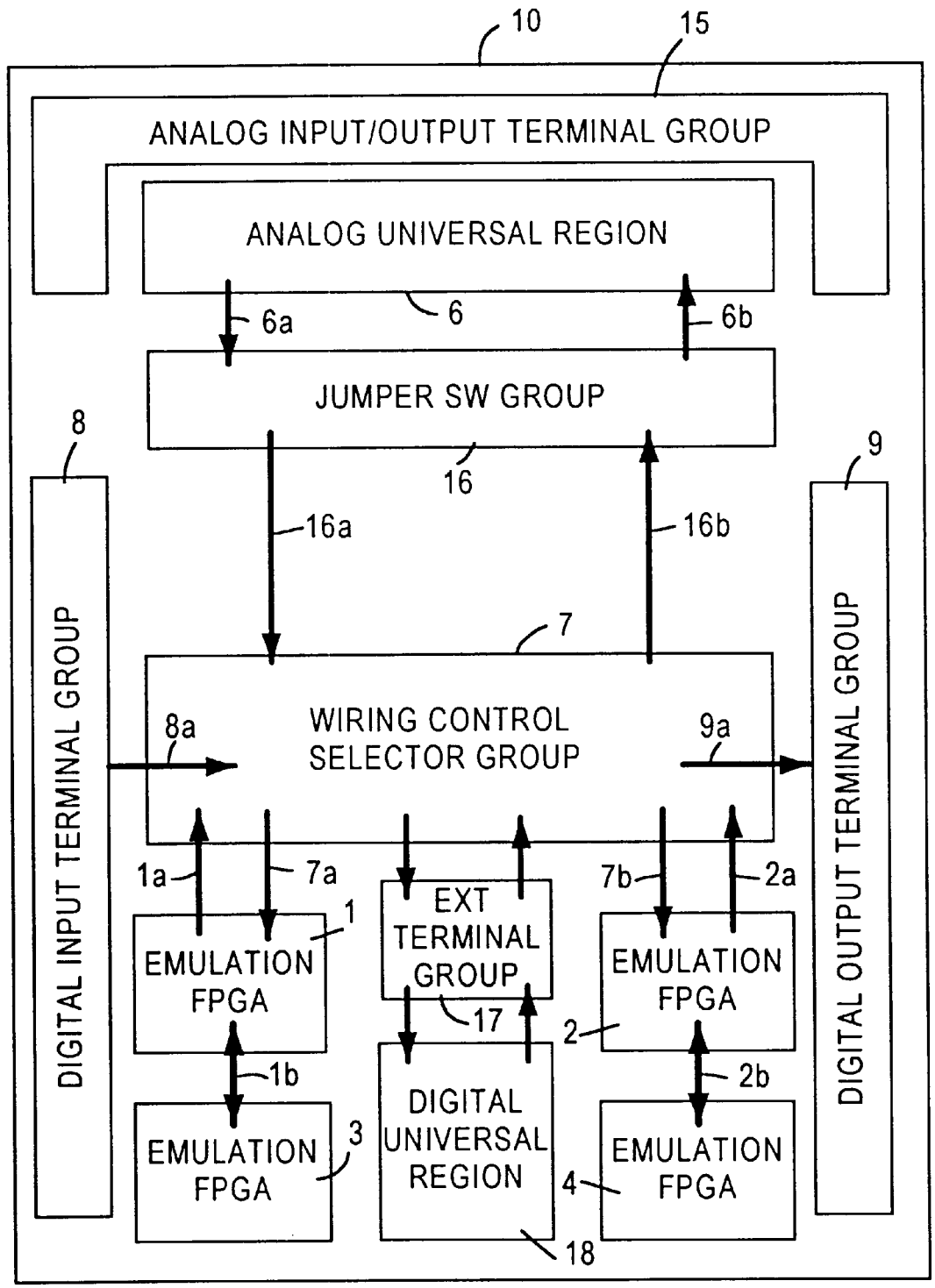
FIG. 5 is a schematic block diagram showing an emulation system according to example 4 of the invention.

FIG. 5 is a schematic block diagram showing an emulation system according to example 4 of the invention.

In the drawing, reference numeral 17 designates a terminal group for digital universal region (hereinafter referred to as "EXT terminal group"), numeral 18 designates a digital universal region connected to the EXT terminal group and in which IC such as multiplier or RAM may be inserted.

Operation of this emulation system is hereinafter described.

Since the EXT terminal group 17 is connected to the wiring control selector group 7 and the digital universal region 18 is a region in which IC such as multiplier or RAM may be inserted, it becomes possible to utilize the IC inserted in the universal digital region 18 for logic verification on the signal processing carried out by the emulation FPGA 1 to 4 by selecting internal connection of the wiring control selector group 7.

The remaining arrangement is same as the foregoing example 3, and repetition of the description is omitted herein.

Since the emulation system is arranged as described above, the IC such as multiplier, RAM difficult to be achieved due to operating speed and chip structure of the FPGA may be inserted in and connected to the digital universal region 18, thereby complementing the emulation FPGA(s) 1 to 4 and making it possible to cope with logic verification on various types of signal processing.

EXAMPLE 5

Figure 6:
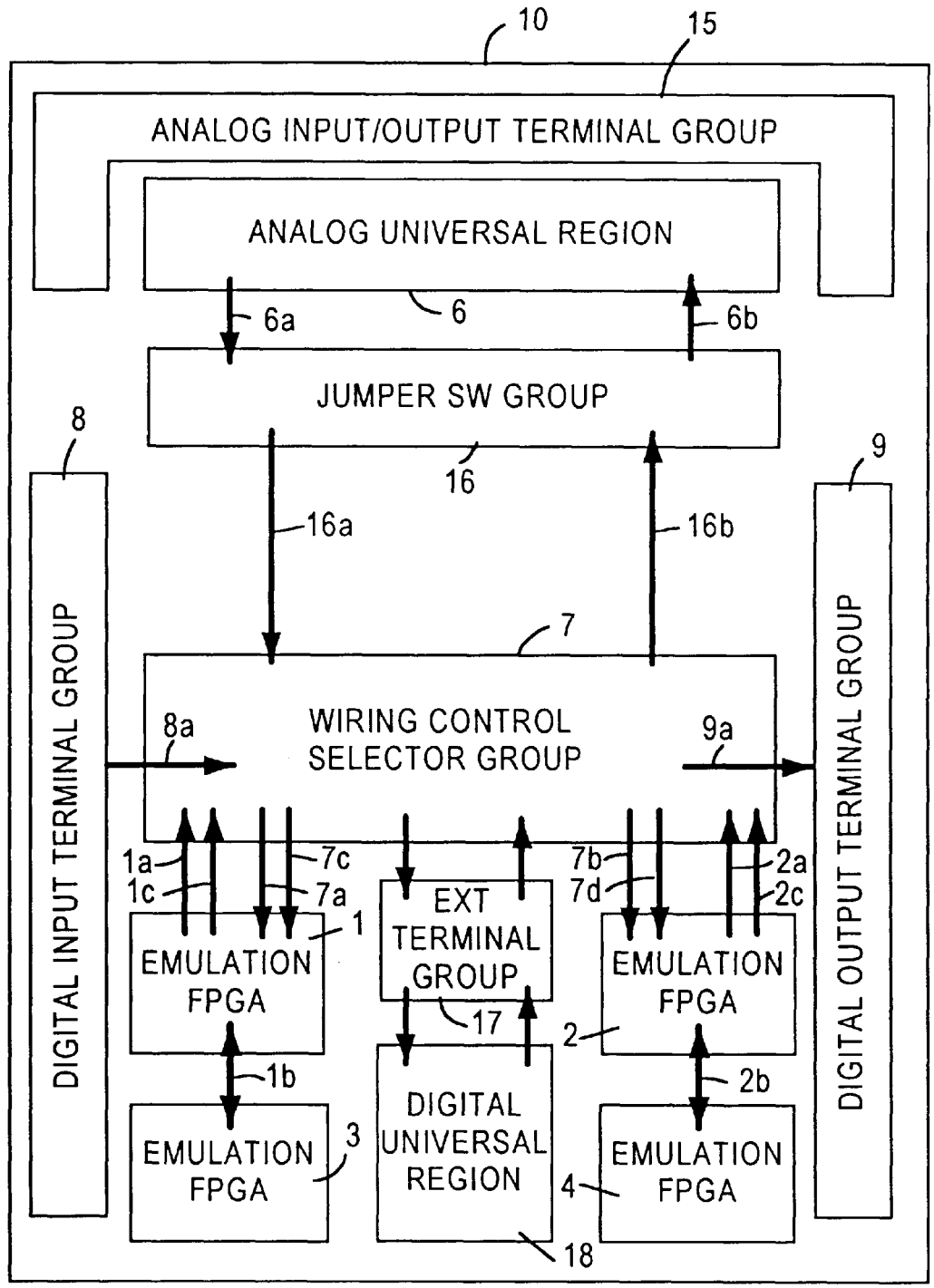
FIG. 6 is a schematic block diagram showing an emulation system according to example 5 of the invention.

FIG. 6 is a schematic block diagram showing an emulation system according to example 5 of the invention.

Output from the wiring control selector group 7 to the emulation FPGA(s) 1 to 4 is carried out by plural bits (by 4 bits, for example) by selectively changing internal connection of the wiring control selector group 7. More specifically, a signal 7*a* to the emulation FPGA 1 or a signal 7*b* to the emulation FPGA 2 may be outputted by plural bits in the form of signals 7*a*, 7*c* or signals 7*b*, 7*d*.

A signal from the digital input terminal group 8, analog universal region 6, digital output terminal group 9 and digital universal region 18 to the wiring control selector group 7 may be also controlled by plural bits.

The remaining arrangement is same as the foregoing example 4, and repetition of the description is omitted herein.

In the emulation system of above arrangement, since output or input to the emulation FPGA(s) 1 to 4 may be carried out by plural bits, the switching and selecting means operated by plural bits may be simplified and suited for carrying out the multi-bit logic verification on image signal, sound signal, etc.

EXAMPLE 6

Figure 7:
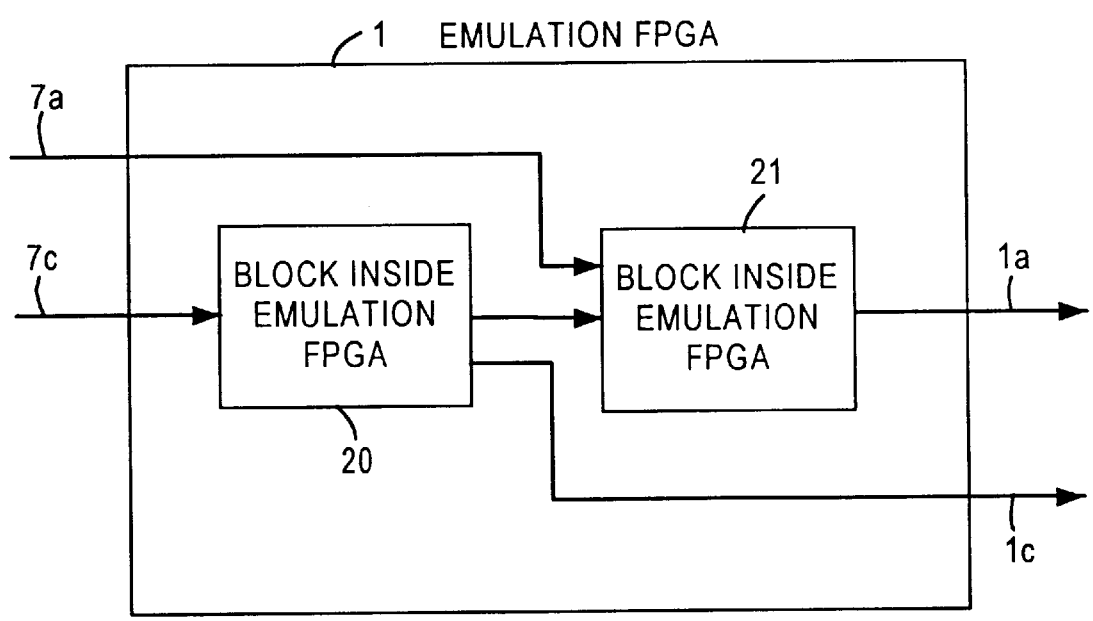
FIG. 7 is a schematic block diagram showing an emulation FPGA according to example 6 of the invention.

FIG. 7 is a schematic block diagram showing the emulation FPGA according to example 6 of the invention.

In the drawing, reference numerals 20 and 21 both designate internal blocks inside the emulation FPGA 1.

Operation of this emulation system is hereinafter described.

At the time of connecting the wiring control selector group 7 to the emulation FPGA 1, input from the blocks 20 and 21 inside the emulation FPGA 1 and output signal on which logic verification has been carried out in the emulation FPGA 1 are connected hierarchy by hierarchy each having one function block. That is, when the signals 7*a*, 7*c* are going to be inputted to the emulation FPGA 1, by selecting internal connection of the wiring control selector group 7, it becomes possible to input the signals to the block 20 or to the block 21, and it becomes also possible to input the output on which logic verification has been carried out in the block 20 to the block 21. The output signals 1*a* and 1*c* are also operated in the same manner as the mentioned input signals. Although the arrangement and operation are described with respect to the emulation FPGA 1, the same operation is carried out also with respect to the other emulation FPGA(s) 2, 3 and 4.

The remaining arrangement is same as the foregoing example 5, and repetition of the description is omitted herein.

In the emulation system of above arrangement, since input to the emulation FPGA 1 and output from the emulation FPGA 1 may be connected hierarchy by hierarchy of the circuit inside the emulation FPGA 1, any verification result in the internal blocks may be easily acknowledged. This emulation system is suitable for comparing verification results carried out in the internal blocks with each other.

EXAMPLE 7

Figure 8:
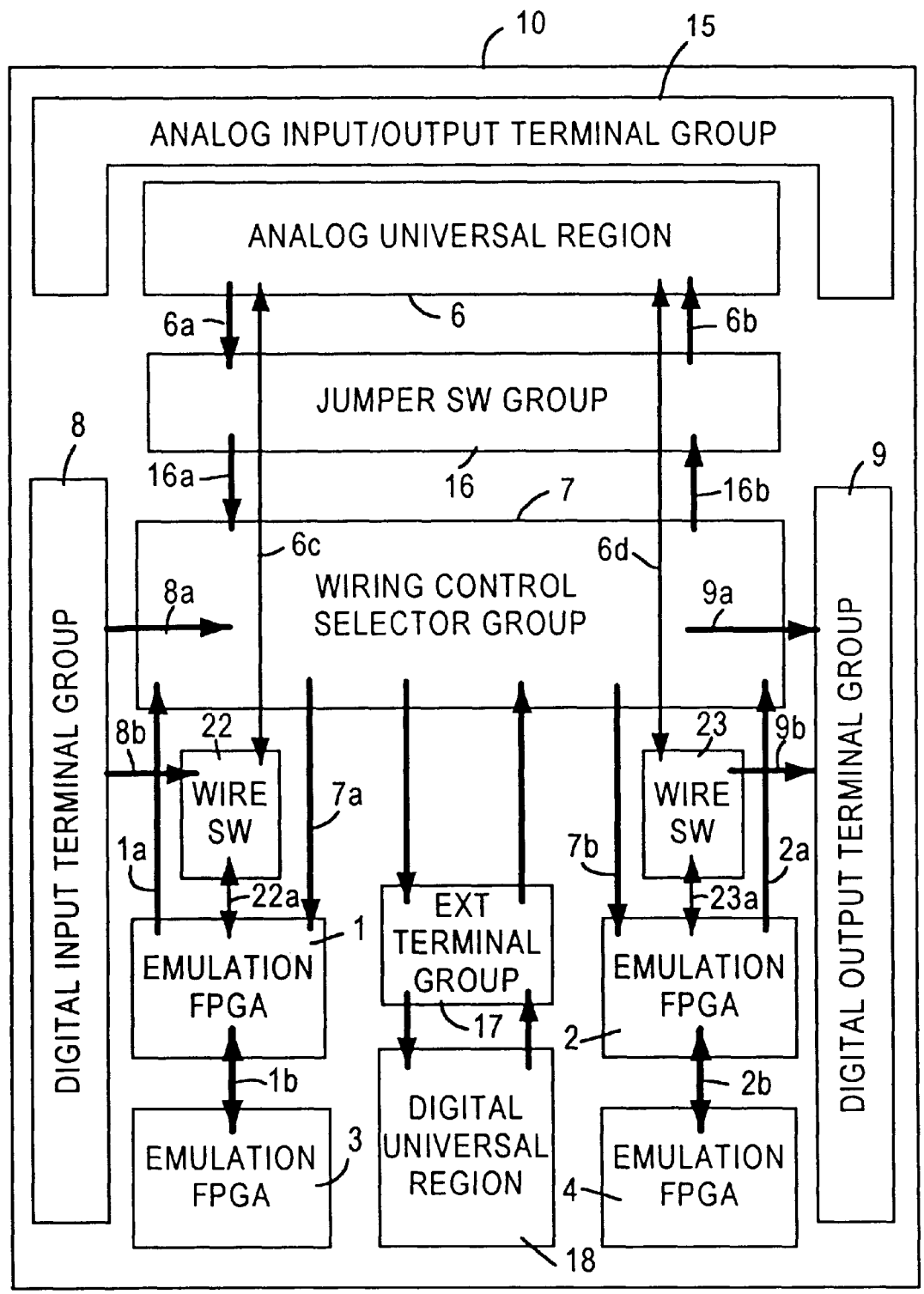
FIG. 8 is a schematic block diagram showing an emulation system according to example 7 of the invention.

FIG. 8 is a schematic block diagram showing the emulation FPGA(s) according to example 7 of the invention.

In the drawings, reference numerals 22 and 23 designate wiring SW(s) respectively.

Operation of this emulation system is hereinafter described.

The wiring SW(s) 22 and 23 are disposed separately from the wiring control selector group 7 described in the foregoing examples 1 to 6 and serve as means for carrying out wiring control at the time of carrying out logic verification in the emulation FPGA(s) 1 to 4.

The signal inputted from the digital input terminal group 8 is inputted not only to the wiring control selector group 7 but also to the wiring SW 22. When turning the wiring SW 22 on, the signal inputted to the digital input terminal group 8 is inputted to the emulation FPGA 1 without being transmitted through the wiring control selector group 7 and, after completing the signal processing, outputted to the wiring control selector group 7.

Further, when turning the wiring SW 23 on, it becomes possible to output the signal from the emulation FPGA 1 to the digital output terminal group 9 without being transmitted through the wiring control selector group 7.

The remaining arrangement is same as the foregoing example 6, and repetition of the description is omitted herein.

In the emulation system of above arrangement, since connection to the FPGA(s) may be directly achieved by turning on or off the wiring SW(s) 22 and 23, such connection using the wiring SW(s) 22 and 23 exhibits an advantage that there is almost no delay in carrying out the wiring control. Although the arrangement and operation between the digital input terminal group 8 and the emulation FPGA (s) are described above, the same advantage is exhibited by inserting the wiring SW(s) 22 and 23 between the emulation FPGA(s), for example.

EXAMPLE 8

Figure 9:
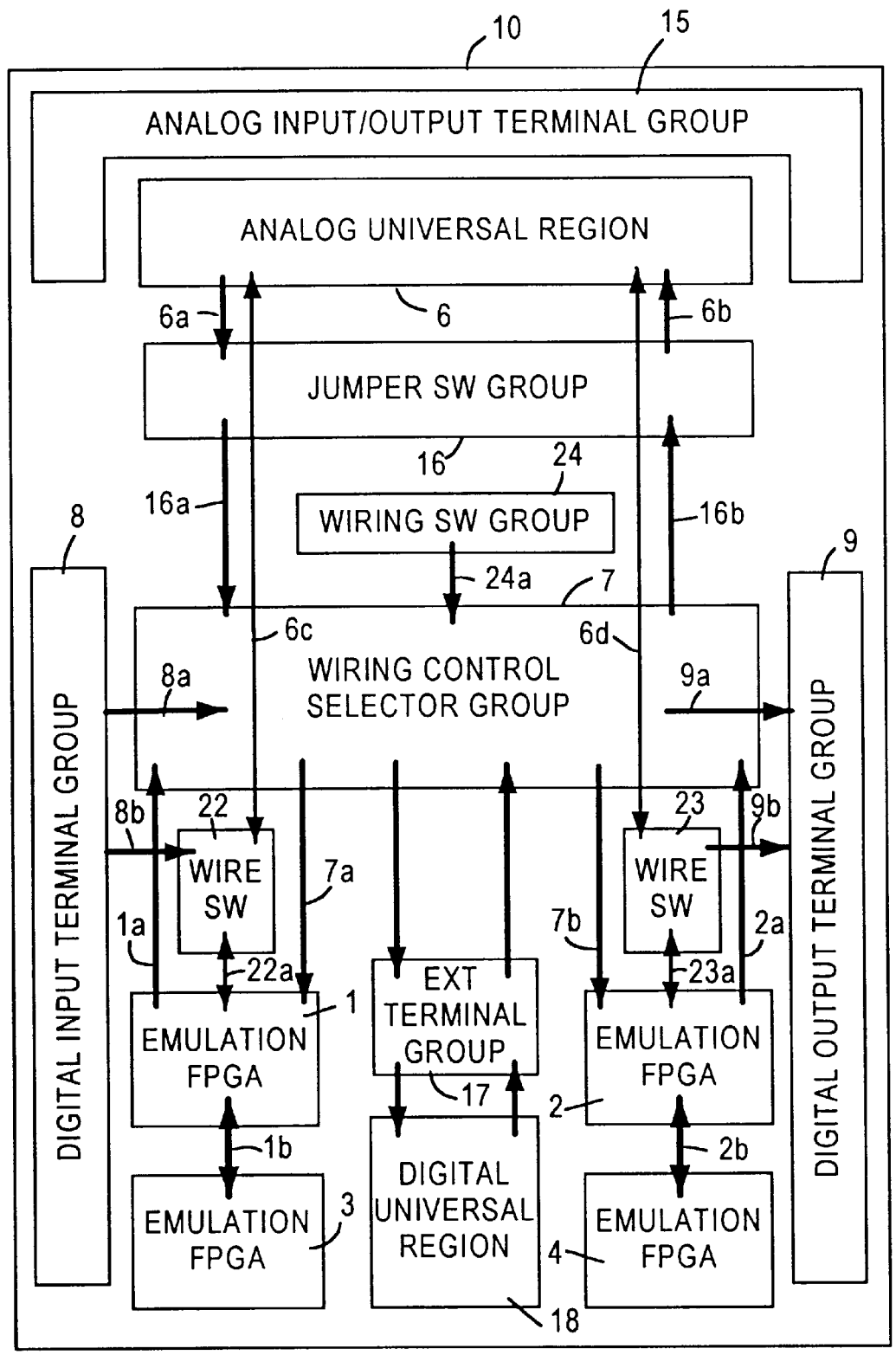
FIG. 9 is a schematic block diagram showing an emulation system according to example 8 of the invention.

FIG. 9 is a schematic block diagram showing the emulation FPGA according to example 8 of the invention.

In the drawings, reference numeral 24 designates a wiring control SW group for selecting internal connection of the wiring control selector group 7.

Operation of this emulation system is hereinafter described.

In this example, for carrying out logic verification on the signal processing of the input signal from the external equipment described referring to example 3 in the emulation FPGA 1, the signal 16*a* converted to any desired signal in the analog universal region 6 and transmitted through the jumper SW group 16 and the signal 8*a* from the digital input terminal group 8 are both connected to the wiring control selector group 7. At the time of carrying out logic verification on either of these two signals, transmission and reception of the signal may be electrically switched by changing set value of the wiring control SW group 24.

It becomes also possible to select the input signal from the analog universal region 6 without being transmitted through the jumper SW group 16.

Although the transmission and reception of signal from the external equipment to the emulation FPGA(s) 1 to 4 are described above, all of the signal output to the external equipment, transmission and reception of signal between the emulation FPGA(s) 1 to 4 and the digital universal region 18, transmission and reception of signal between the emulation FPGA(s) 1 to 4 themselves, transmission and reception of signal by plural bits, and transmission and reception of signal to each hierarchy of the internal circuit of the emulation FPGA may be electrically switched by changing set value of the wiring control SW group 24.

The remaining arrangement is same as the foregoing example 7, and repetition of the description is omitted herein.

In the emulation system of above arrangement, transmission and reception of the signal for carrying out logic verification in the emulation FPGA may be electrically switched without changing any wiring control circuit of the wiring control selector group 7. Accordingly, the input/output signal to the emulation FPGA may be switched without changing internal connection of the wiring control selector group 7.

EXAMPLE 9

Figure 10:
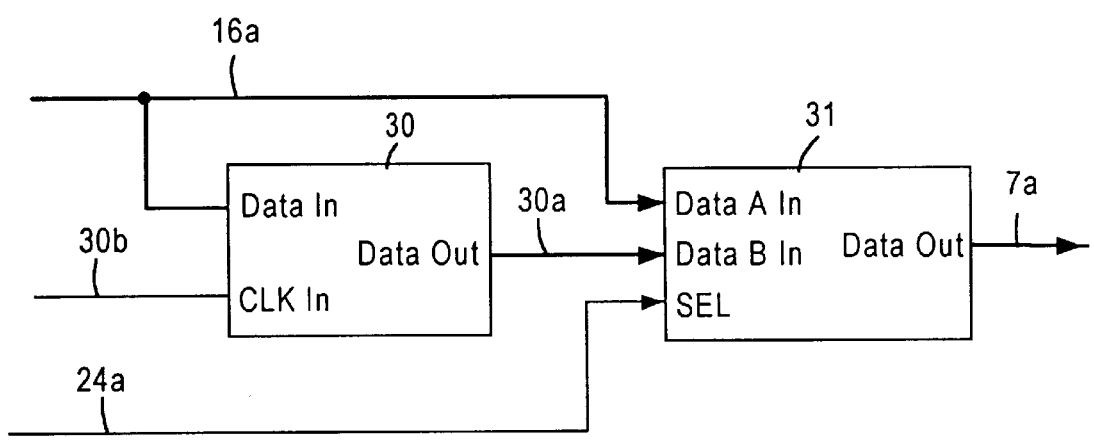
FIG. 10 is a schematic block diagram showing a part of the internal circuit of the wiring control selector group according to example 9 of the invention.

FIG. 10 is a schematic block diagram showing a part of the internal circuit of the wiring control selector group according to example 9 of the invention.

In the drawings, reference numeral 30 designates a register, numeral 31 designates a selector, and numeral 30*b* designates a system clock used in this emulation system.

Operation of this emulation system is hereinafter described.

The signal 6*a* from the analog universal region 6 is inputted as the signal 16*a* to the register 30 and to the selector 31 through the jumper SW group 16. Data 30*a* delayed by 1 clock of the system clock 30*b* in the register 30 is also inputted to the selector 31. When switching the wiring control SW group 24, output of the selector 31 may be selected by the signal 24*a*. Although the signal between the analog universal region 6 and the emulation FPGA 1 is described above, the same operation is carried out also with respect to the other signals.

The remaining arrangement is same as the foregoing example 9, and repetition of the description is omitted herein.

In the emulation system of above arrangement, delay of the output signal from the wiring control selector group 7 to the emulation FPGA(s) may be achieved by delay in insertion of a known delay time, and means depending on the performance of device used in the wiring control selection group 7 may be selected by setting the wiring control SW group 24. When it is required to improve speed of the circuit for carrying out logic verification on signal processing, since there is no wiring delay in the wiring control selector group 7 by selecting the signal delayed by inserting the register 30, the speed of the circuit carrying out logic verification may be improved. When selecting the signal in which the register 30 is not inserted, any register for adjusting timing to the circuit carrying out logic verification is no longer necessary, resulting in scale-down of the circuit.

EXAMPLE 10

Figure 11:
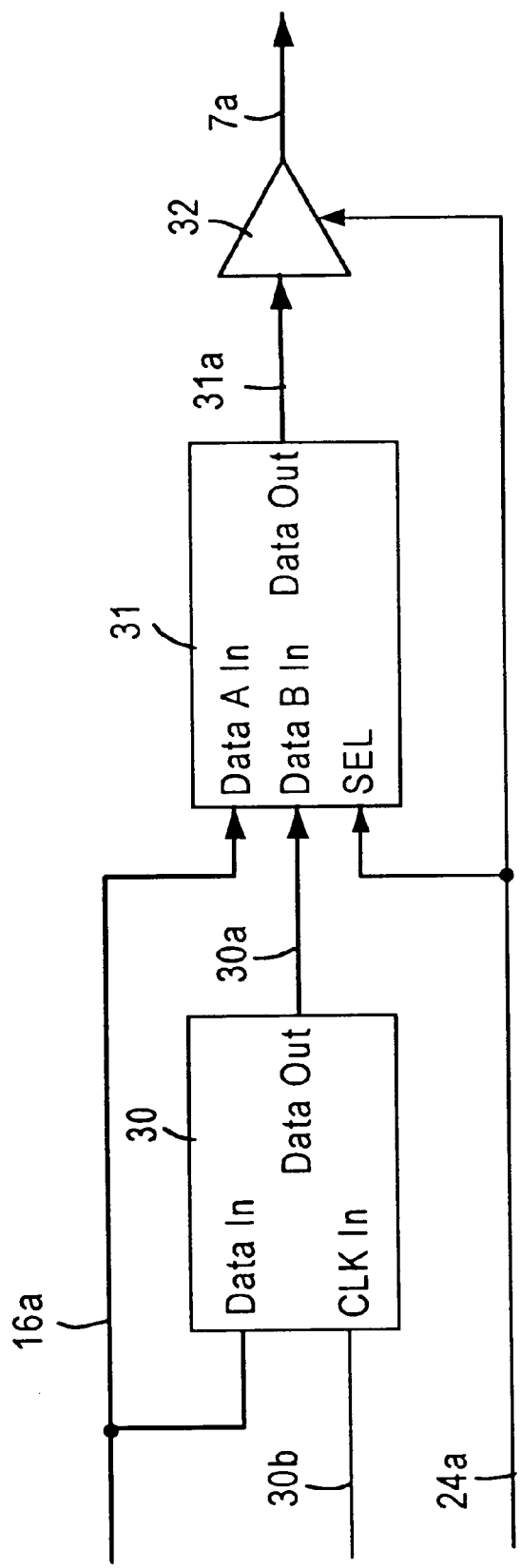
FIG. 11 is a schematic block diagram showing a part of the internal circuit of the wiring control selector group according to example 10 of the invention.

FIG. 11 is a schematic block diagram showing a part of the internal circuit of the wiring control selector group according to example 10 of the invention.

In the drawing, reference numeral 32 designates a tristate buffer.

Operation of this emulation system is hereinafter described.

The tristate buffer 32 brings impedance of the signal 6*a* from the analog universal region 6 to be high (to a high resistance value) through the wiring control selector group 7 by switching the wiring control SW group 24, and connects the signal 6*a* to the emulation FPGA 1. In other words, only one type of signal may be inputted to the emulation FPGA 1 by connecting an input pin of the emulation FPGA 1 to two signal lines which transmit two types (or several types) of signals, switching the wiring control SW group 24 and bringing one signal line to a high impedance. Although the emulation FPGA 1 is described above, the same operation is carried out also with respect to the emulation FPGA(s) 2 to 4.

The remaining arrangement is same as the foregoing example 9, and repetition of the description is omitted herein.

In the emulation system of above arrangement, the emulation FPGA may be connected to the input pin through plural signal lines, and logic verification on signal processing may be carried out by connecting many different signal lines to the input pin of the emulation FPGA and obtaining the input signal selected from the connected signal lines. As a result, there is an advantage that more internal nodes of the emulation system than number of pins of the emulation FPGA may be connected.

EXAMPLE 11

Figure 12:
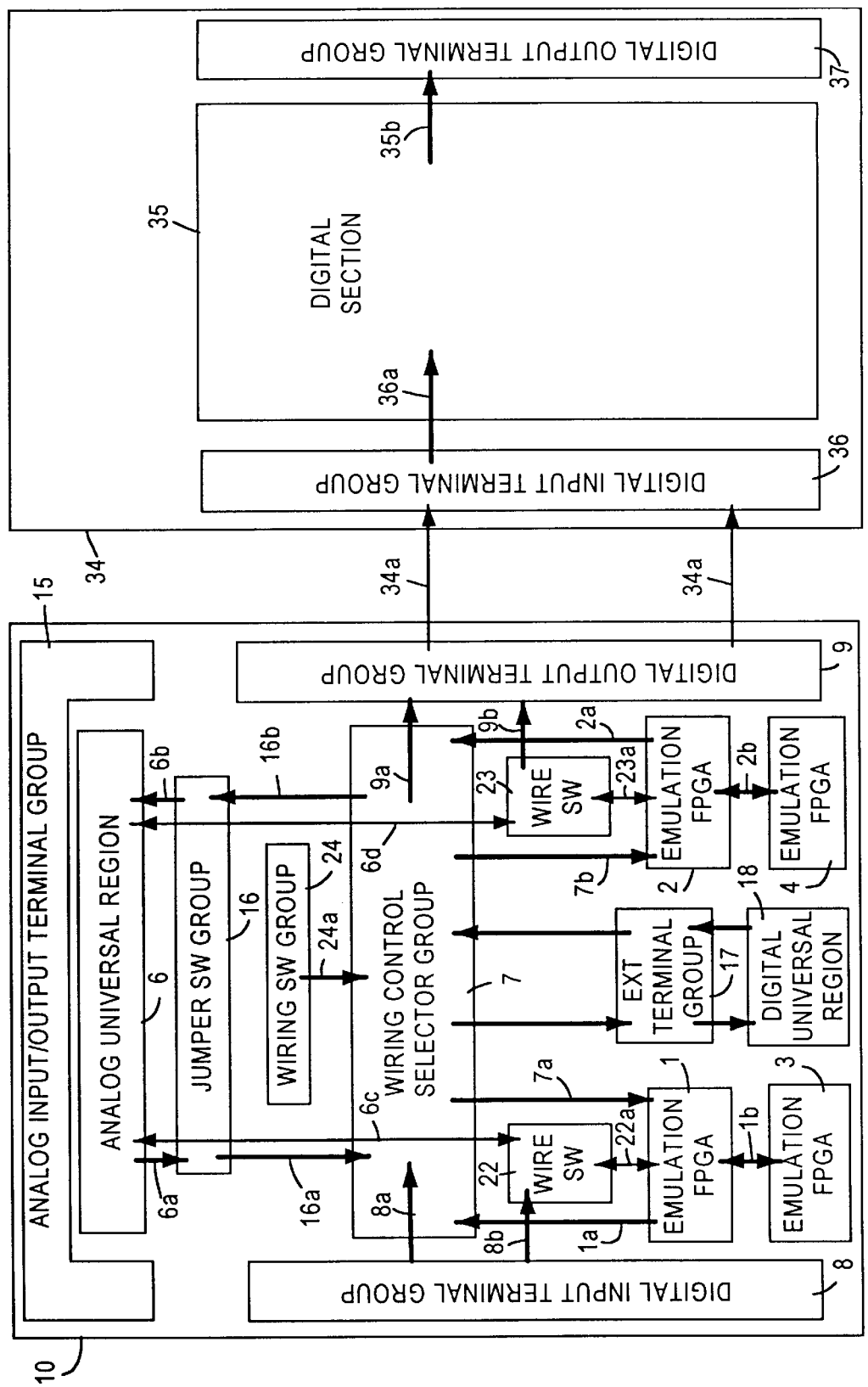
FIG. 12 is a schematic block diagram showing an emulation system according to example 11 of the invention.

FIG. 12 is a schematic block diagram showing an emulation system according to example 11 of the invention.

In the drawing, reference numeral 34 designates another emulation system, numeral 35 designates a digital section of the emulation system, numeral 36 is a digital input terminal group of the emulation system 34, and numeral 37 is a digital output terminal group of the emulation system 34.

Operation of this emulation system is hereinafter described.

The emulation system 34 is the same emulation system as those described in examples 1 to 11. In the emulation system 10, the signal on which logic verification has been carried out is either outputted from the digital output terminal group 9 or outputted to the external equipment after being converted to an analog signal in the analog universal region 6. When the terminals of the digital input terminal group 36 are arrayed in the same manner as those of the digital output terminal group 9 thereby forming a cascade connection, the signal on which logic verification has been carried out may be inputted to the digital input terminal group 36 of the emulation system 34. it becomes also possible to carry out logic verification by returning the signal on which logic verification has been carried out in the emulation system 34 to the emulation system 34.

The remaining arrangement is same as the foregoing example 10, and repetition of the description is omitted herein.

In the emulation system of above arrangement, since the plural emulation systems are used to carry out logic verification, circuit scale for carrying out logic verification on signal processing is enlarged, there is an advantage that even when it is difficult for only one emulation system to cope with, the difficulty may be easily overcome by sharing the circuit carrying out logic verification and by connecting the plural emulation systems in cascade connection.

EXAMPLE 12

Figure 13:
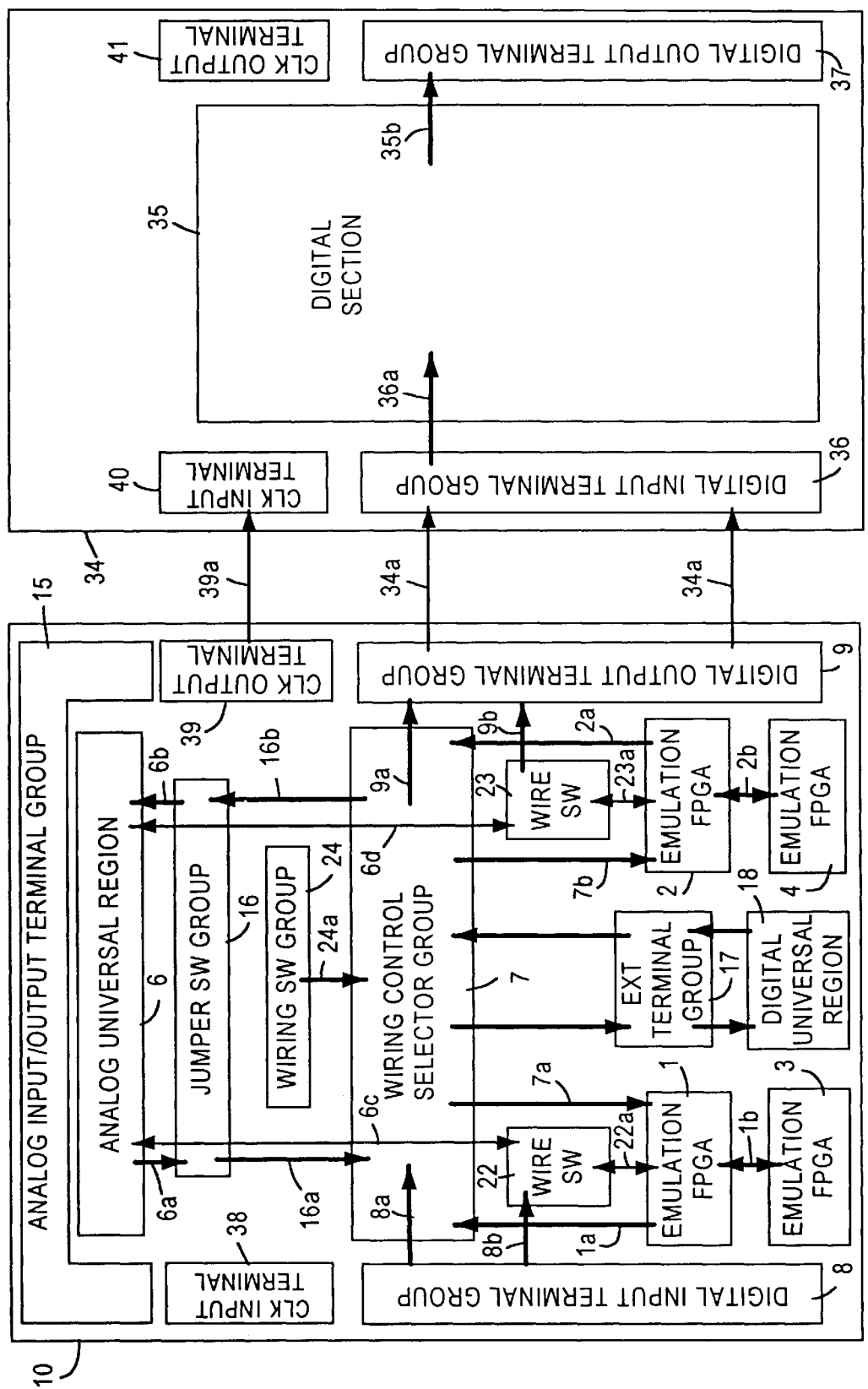
FIG. 13 is a schematic block diagram showing an emulation system according to example 12 of the invention.

FIG. 13 is a schematic block diagram showing an emulation system according to example 12 of the invention.

In the drawing, reference numeral 38 designates a CLK input terminal, numeral 39 designates a CLK output terminal, numeral 40 is a CLK input terminal of the emulation system 34, and numeral 41 is a CLK output terminal of the emulation system 34.

Operation of this emulation system is hereinafter described.

System clock inputted from external equipment or supplied from the analog universal region 6 is further supplied to the wiring control selector group 7 inside the emulation system 10 and to the CLK output terminal 39 of the emulation FPGA 1, 2, 3 and 4. The system clock 39a outputted from the CLK output terminal 39 is inputted to the CLK input terminal 40 of the emulation system cascade-connected to the emulation system 10 and supplied to the digital section 35 of the emulation system 34. Although the cascade-connected two emulation systems are described herein, the same operation is carried out also when more than two emulation systems are used together. It is also preferable that for the CLK input/output terminals, some of the pins of the digital input/output terminal group are employed as pins for exclusive use of CLK. The remaining arrangement is same as the foregoing example 11, and repetition of the description is omitted herein.

In the emulation system of above arrangement, since the same system clock is distributed to every emulation system in case of a large scale circuit requiring a plurality of emulation systems, it is no more necessary to prepare any system clock for each emulation system. Furthermore, any wiring connection by manual work is not required for the distribution of the system clock to the second and further emulation systems.

EXAMPLE 13

Figure 14:
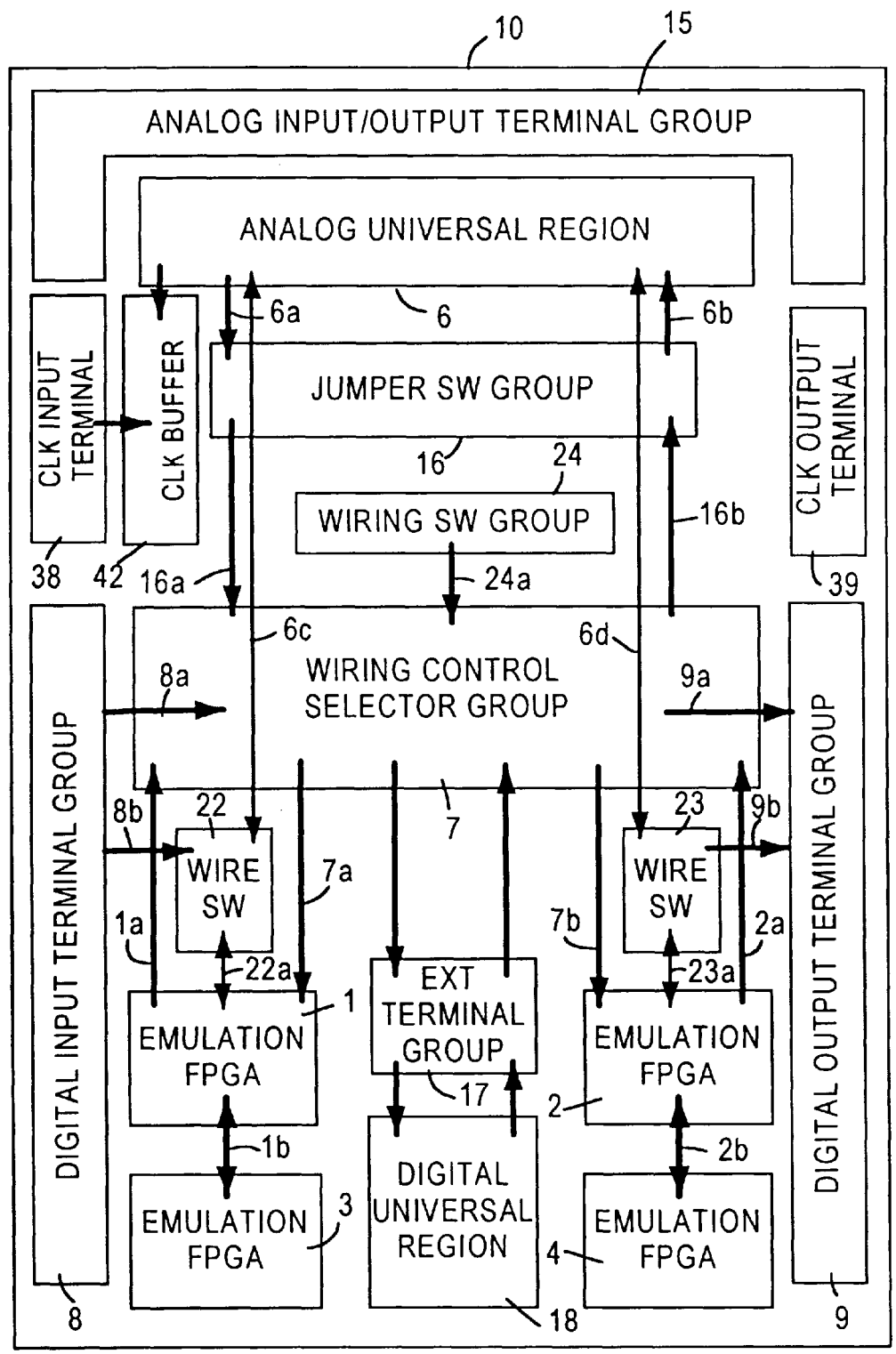
FIG. 14 is a schematic block diagram showing an emulation system according to example 13 of the invention.

FIG. 14 is a schematic block diagram showing an emulation system according to example 13 of the invention.

In the drawing, reference numeral 42 designates a CLK buffer.

Operation of this emulation system is hereinafter described.

The system clock inputted from external equipment or that generated in the analog universal region 6 is inputted to the CLK buffer 42. Then, the system clock inputted to the CLK buffer 42, being transmitted through a predetermined step number of buffers, is distributed to the regions such as emulation FPGA(s), wiring control selector group 7, digital universal region 18.

In the emulation system of above arrangement, since the system clock inside one emulation system, being transmitted through the predetermined step number of CLK buffer 42, may be distributed to respective regions, i.e., a system clock of the same step number of buffers may be distributed, a constant clock may be stably supplied.

EXAMPLE 14

Figure 15:
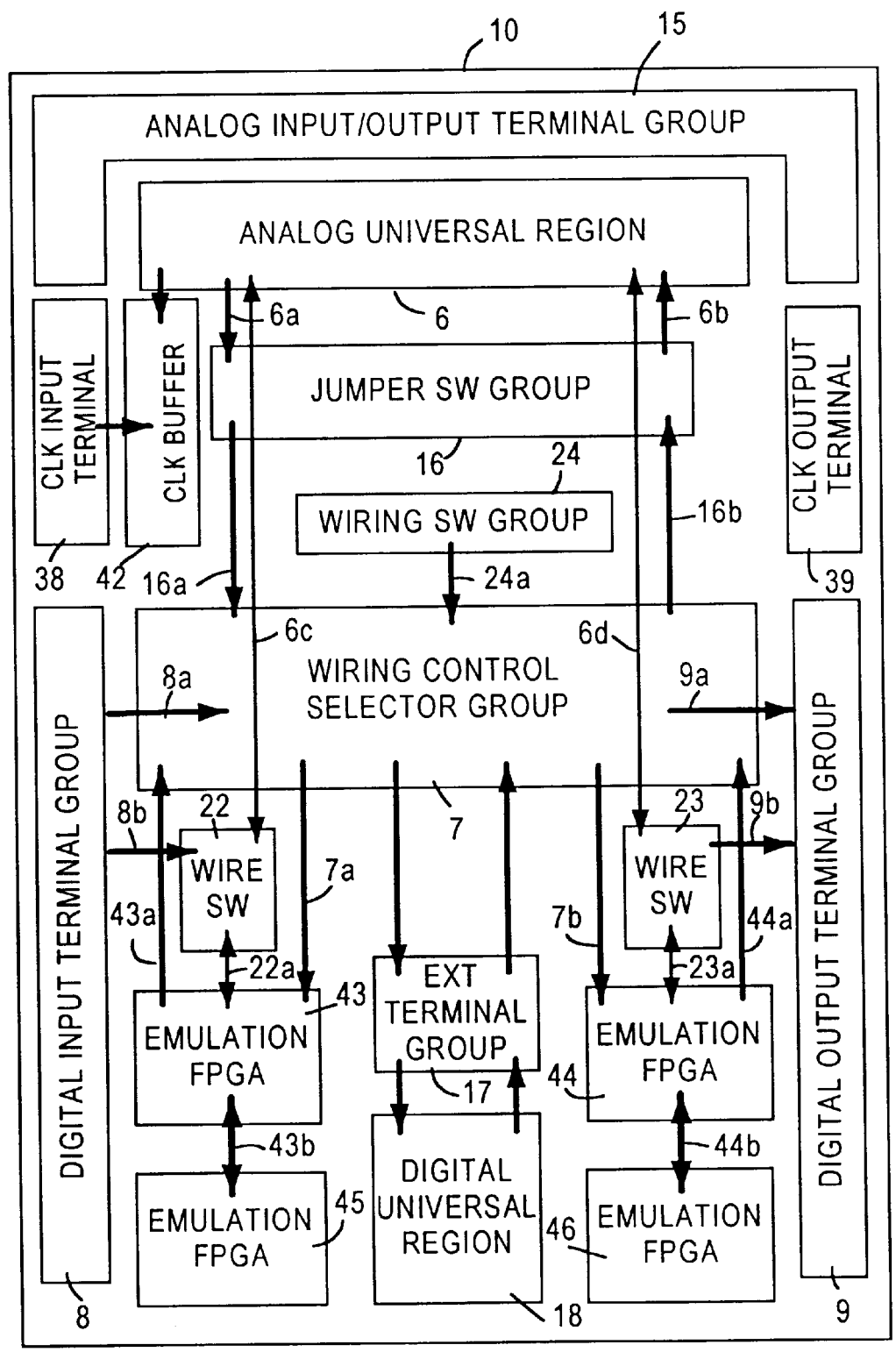
FIG. 15 is a schematic block diagram showing an emulation system according to example 14 of the invention.

FIG. 15 is a schematic block diagram showing an emulation system according to example 14 of the invention.

In the drawing, reference numerals 43 to 46 designate emulation FPGA(s).

Operation of this emulation system is hereinafter described.

Supposing that the emulation FPGA(s) 1 to 4 described in the foregoing examples are devices manufactured by Company A and the emulation FPGA(s) 43 to 46 are devices manufactured by Company B (provided that both Company A's devices and Company B's devices have the same number of FPGA pins and external dimensions), any signal line is assigned to the pins of different devices by switching the wiring control SW group 24 thereby changing electrically the connection from the wiring control selector group 7 to the emulation FPGA(s). Although the Company A's devices and Company B's devices form separate FPGA(s) in the above description, the same advantage will be achieved when two company's devices are mixedly used.

The remaining arrangement is same as the foregoing example 13, and repetition of the description is omitted herein.

In the emulation system of above arrangement, since the devices of different manufacturers may be used in the same emulation system without any circuit change, a variety of devices may be used in the form of putting a right device in the right place depending on the type of circuit for carrying out logic verification.

EXAMPLE 15

Figure 16:
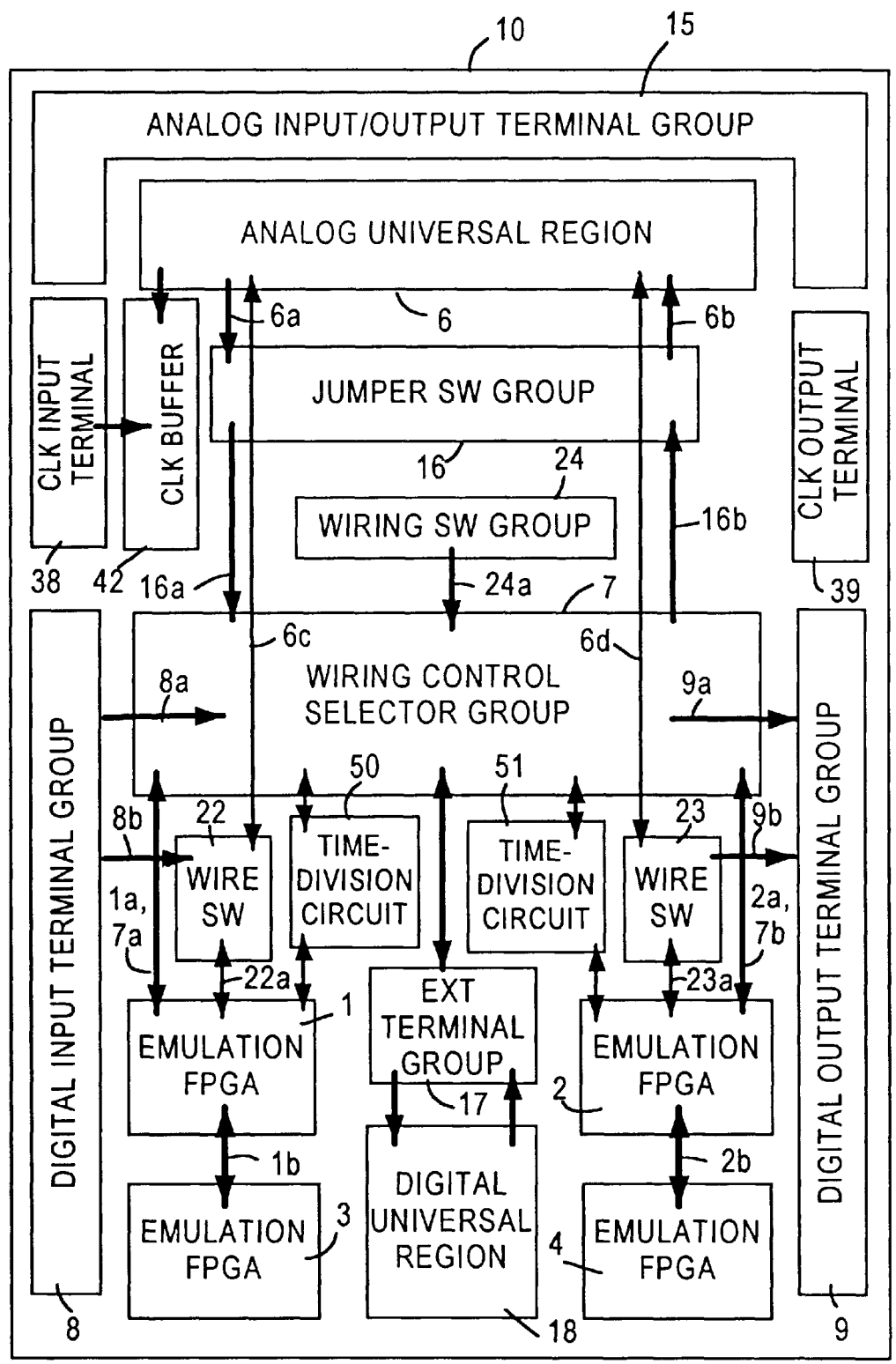
FIG. 16 is a schematic block diagram showing an emulation system according to example 15 of the invention.

FIG. 16 is a schematic block diagram showing an emulation system according to example 15 of the invention.

In the drawing, reference numerals 50 designates a time-division circuit connected between the wiring control selector group 7 and the emulation FPGA(s) 1 and 3. Numerals 51 designates a time-division circuit connected between the emulation FPGA(s) 2 and 4 and the wiring control selector group 7.

Operation of this emulation system is hereinafter described.

The signal outputted from the wiring control selector group 7 may select either the signal path described in the foregoing examples or the signal path connected to the time-division circuit 50 by changing the setting of the wiring control SW group 24. The time division circuit 50 converts the inputted serial signal to a parallel signal. The time division circuit 51 converts the parallel signal having carried out logic verification on the signal processing to a serial signal and outputs the serial signal to the external equipment or to the analog universal region 6 through the wiring control selector group 7.

The remaining arrangement is same as the foregoing example 14, and repetition of the description is omitted herein.

In the emulation system of above arrangement, since the inputted signal may be converted in the time division circuits 50 and 51, the simulation system is effective for a circuit in which signal speed is required.

EXAMPLE 16

Figure 17:
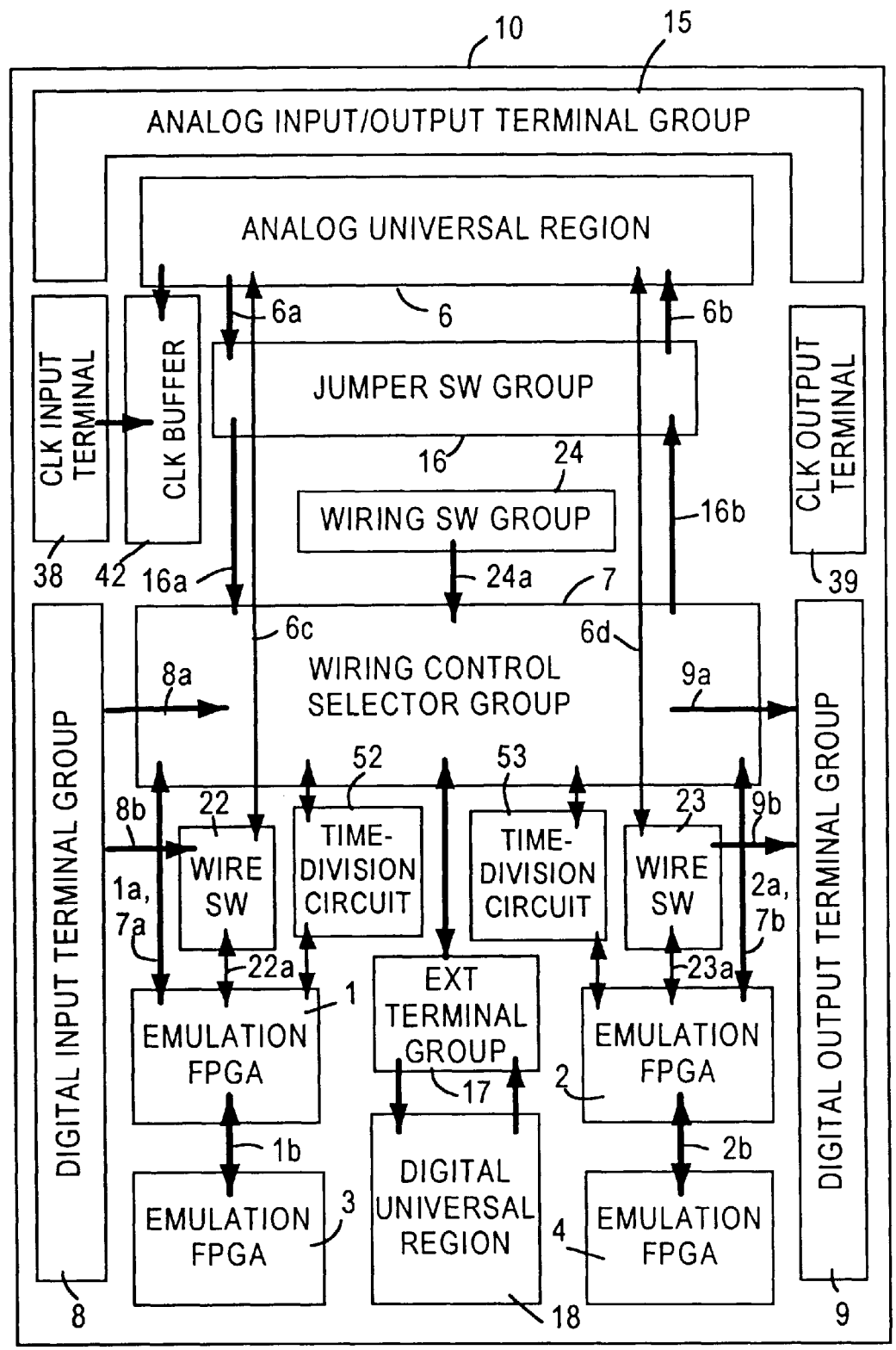
FIG. 17 is a schematic block diagram showing an emulation system according to example 16 of the invention.

FIG. 17 is a schematic block diagram showing an emulation system according to example 16 of the invention.

In the drawing, reference numeral 52 designates a time-division circuit connected between the wiring control selector group 7 and the emulation FPGA(s) 1 and 3. Numerals 53 designates a time-division circuit connected between the emulation FPGA(s) 2 and 4 and the wiring control selector group 7.

Operation of this emulation system is hereinafter described.

The signal outputted from the wiring control selector group 7 may select either the signal path described in the foregoing examples or the signal path connected to the time-division circuit 52.

The time-division circuit 52 converts the inputted parallel signal to a serial signal. The time-division circuit 53 converts the serial signal having carried out logic verification on the signal processing to a parallel signal and outputs the parallel signal to the external equipment or to the analog universal region 6 through the wiring control selector group 7.

The remaining arrangement is same as the foregoing example 15, and repetition of the description is omitted herein.

In the emulation system of above arrangement, since the inputted signal may be converted in the time-division circuits 52 and 53, it becomes possible not only to reduce number of input/output pins used in the emulation FPGA(s) but also to cope with any circuit which requires a signal line of multiple pins.

EXAMPLE 17

Figure 18:
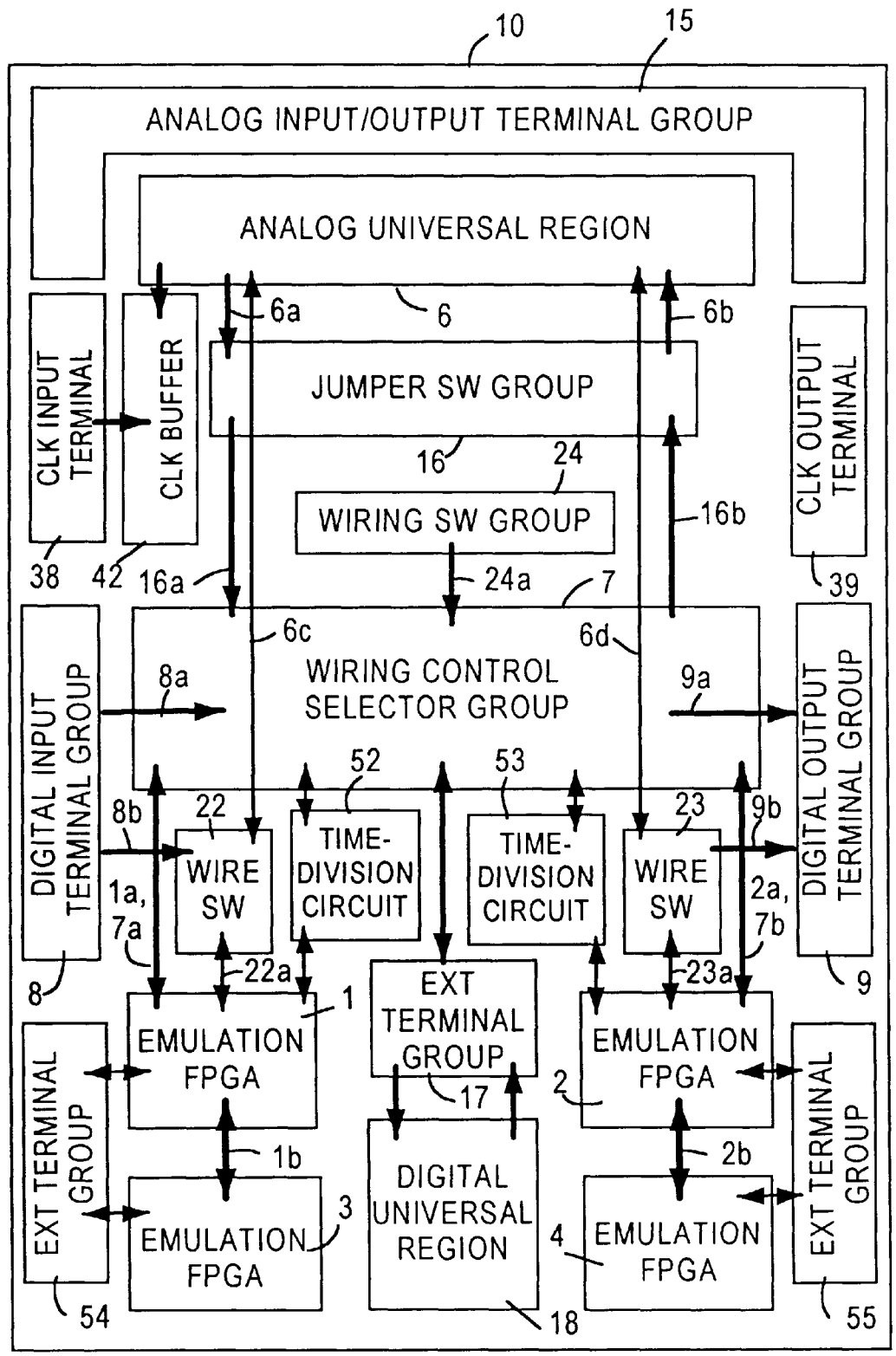
FIG. 18 is a schematic block diagram showing an emulation system according to example 17 of the invention.
Figure 19:
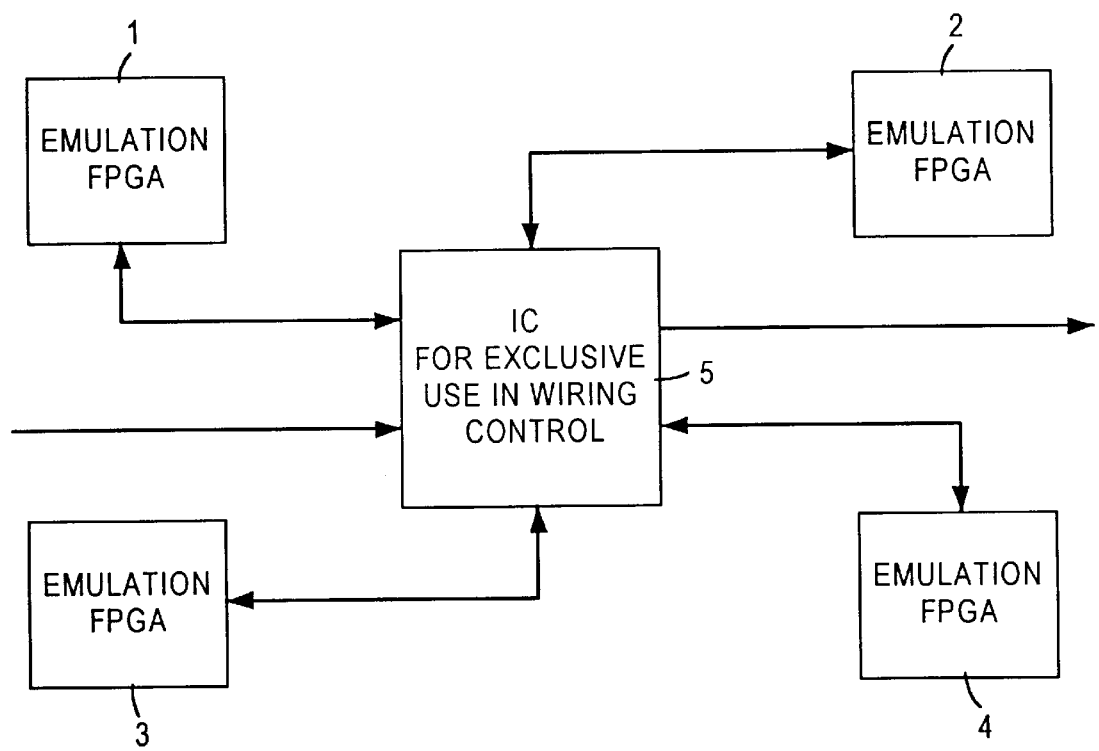
FIG. 19 is a schematic block diagram showing an emulation system according to the prior art.

FIG. 18 is a schematic block diagram showing an emulation system according to example 17 of the invention.

In the drawing, reference numeral 54 designates an EXT terminal group directly connected to the emulation FPGA(s) 1 and 3. Numeral 55 designates another EXT terminal group directly connected to the emulation FPGA(s) 2 and 4.

Operation of this emulation system is hereinafter described.

The signal inputted to the EXT terminal group 54 is directly connected to the emulation FPGA(s) 1 and 3 without being transmitted through the wiring control selector group 7. In the emulation system of above arrangement, a signal from the signal line such as $I^2C$ bus essentially required at the time of forming a system on the EXT terminal group 54 may be directly transmitted or received to and from the emulation FPGA 1 or 3 through the EXT terminal group 54. The same operation is performed also by the EXT terminal group 55.

The remaining arrangement is same as the foregoing example 16, and repetition of the description is omitted herein.

In the emulation system of above arrangement, since the EXT terminal groups may be directly connected to the emulation FPGA(s) thereby any signal from external microcomputer (or personal computer) may be taken in the emulation system(s), this emulation system is suitable for carrying out logic verification on the entire system.

It should also be understood that the foregoing relates to only several preferred embodiments of the invention, and that it is intended to cover all changes and modifications of the examples of the invention herein chosen for the purposes of the disclosure, which do not constitute departures from the spirit and scope of the invention.

What is claimed is:

1. An emulation system comprising:
   a digital input terminal section to which a digital signal is inputted;
   a plurality of field programmable gate arrays for verifying logic of the signal inputted to said digital input terminal section;
   a digital output terminal section for outputting a signal of which logic has been verified by said field programmable gate arrays;
   a wiring control selector section which is connected to said digital input terminal section and to said digital output terminal section for selecting whether signals transmitted between the plurality of field programmable gate arrays are transmitted between said arrays via the wiring control selector section; and
   an analog universal region connected to said wiring control selector section and including a circuit for converting an analog signal into a digital signal.

2. An emulation system according to claim 1, wherein an analog input/output terminal section for carrying out either input or output of the analog signal to or from said analog universal region or both of the input and output.

3. An emulation system according to claim 2, wherein said analog input/output terminal section is provided with either an image signal terminal or a sound signal terminal or both of the image signal terminal and sound signal terminal.

4. An emulation system according to claim 1, further comprising input selecting means for selecting whether an input signal inputted to said wiring control selector section comes from said digital output terminal section or from said analog universal region.

5. An emulation system according to claim 1, further comprising output selecting means for selecting whether an output signal from said wiring control selector section is outputted from said digital output terminal section or from said analog universal region.

6. An emulation system according to claim 1, wherein said wiring control selector section has either a function for selecting whether an input signal comes from said digital input terminal section or from said analog universal region or a function for selecting whether an output signal is outputted from said digital output section or from said analog universal region or both of said two functions.

7. An emulation system according to claim 1, further comprising a digital universal region in which a digital external circuit may be inserted so that the external circuit is also used in logic verification carried out by said plurality of field programmable gate arrays.

8. An emulation system according to claim 1, wherein said wiring control selector section may input and output said signal between the wiring control selector section and said plurality of field programmable gate arrays by plural bits.

9. An emulation system according to claim 1, wherein said wiring control selector section may input and output the signal for each block forming an internal circuit of each field programmable gate array.

10. An emulation system comprising:

a digital input terminal section to which a digital signal is inputted;

a plurality of field programmable gate arrays for verifying logic of the signal inputted to said digital input terminal section;

a digital output terminal section for outputting a signal of which logic has been verified by said field programmable gate arrays;

a wiring control selector section which is connected to said digital input terminal section and to said digital output terminal section for selecting whether signals transmitted between the plurality of field programmable gate arrays are transmitted between said arrays via the wiring control selector section;

an analog universal region connected to said wiring control selector section and including a circuit for converting an analog signal into a digital signal; and further comprising a wiring switch disposed on either a signal input from said digital input terminal section to said plurality of field programmable gate arrays or a signal output from said plurality of field programmable gate arrays to said digital output terminal section or on both of the signal input and signal output, whereby the emulation system is capable of selecting either a signal path passing through said wiring switch or a signal path not passing through said wiring switch.

11. An emulation system comprising:

a digital input terminal section to which a digital signal is inputted;

a plurality of field programmable gate arrays for verifying logic of the signal inputted to said digital input terminal section;

a digital output terminal section for outputting a signal of which logic has been verified by said field programmable gate arrays;

a wiring control selector section which is connected to said digital input terminal section and to said digital output terminal section for selecting whether signals transmitted between the plurality of field programmable gate arrays are transmitted between said arrays via the wiring control selector section;

an analog universal region connected to said wiring control selector section and including a circuit for converting an analog signal into a digital signal; and further comprising a wiring switch disposed among said plurality of field programmable gate arrays, whereby the emulation system is capable of selecting either a signal path passing through said wiring switch or a signal path not passing through said wiring switch.

12. An emulation system comprising:

a digital input terminal section to which a digital signal is inputted;

a plurality of field programmable gate arrays for verifying logic of the signal inputted to said digital input terminal section;

a digital output terminal section for outputting a signal of which logic has been verified by said field programmable gate arrays;

a wiring control selector section which is connected to said digital input terminal section and to said digital output terminal section for selecting whether signals transmitted between the plurality of field programmable gate arrays are transmitted between said arrays via the wiring control selector section; and an analog universal region connected to said wiring control selector section and including a circuit for converting an analog signal into a digital signal;

wherein said wiring control selector section is provided with a wiring control switch group capable of switching the wiring of the wiring control selector section by changing a set value.

13. An emulation system according to claim 12, wherein said wiring control selector section is provided with delay means for generating a signal delayed for a certain time as a signal of the selected signal path, whereby either a signal delayed by said delay means or a signal not delayed by said delay means may be selected by changing setting of said wiring control switch group.

14. An emulation system according to claim 12, wherein each field programmable gate array is provided with an input pin to which a plurality of signal lines for inputting signals may be connected, and selection of a signal line among those signal lines may be carried out by changing setting of said wiring control switch group.

15. An emulation system according to claim 14, wherein said selection of a signal line among the plurality of signal lines is carried out by increasing impedance of the signal lines not selected to be high.

16. An emulation system according to claim 1, further comprising a clock input terminal for inputting a clock signal and a clock output terminal for outputting the clock signal.

17. An emulation system comprising:

a digital input terminal section to which a digital signal is inputted;

a plurality of field programmable gate arrays for verifying logic of the signal inputted to said digital input terminal section;

a digital output terminal section for outputting a signal of which logic has been verified by said field programmable gate arrays;

a wiring control selector section which is connected to said digital input terminal section and to said digital output terminal section for selecting whether signals transmitted between the plurality of field programmable gate arrays are transmitted between said arrays via the wiring control selector section;

an analog universal region connected to said wiring control selector section and including a circuit for converting an analog signal into a digital signal; and a clock input terminal for inputting a clock signal and a clock output terminal for outputting the clock signal;

wherein said clock input terminal uses one of terminals of said digital input terminal section, and said clock output terminal uses one of terminals of said digital output terminal section, respectively.

18. An emulation system comprising:

a digital input terminal section to which a digital signal is inputted;

a plurality of field programmable gate arrays for verifying logic of the signal inputted to said digital input terminal section;

a digital output terminal section for outputting a signal of which logic has been verified by said field programmable gate arrays;

a wiring control selector section which is connected to said digital input terminal section and to said digital output terminal section for selecting whether signals transmitted between the plurality of field programmable gate arrays are transmitted between said arrays via the wiring control selector section;

an analog universal region connected to said wiring control selector section and including a circuit for converting an analog signal into a digital signal;

a clock input terminal for inputting a clock signal and a clock output terminal for outputting the clock signal; and further comprising a clock buffer having a predetermined number of stages for distributing a clock signal and supplying the clock signal to each internal circuit.

19. An emulation system comprising:

a digital input terminal section to which a digital signal is inputted;

a plurality of field programmable gate arrays for verifying logic of the signal inputted to said digital input terminal section;

a digital output terminal section for outputting a signal of which logic has been verified by said field programmable gate arrays;

a wiring control selector section which is connected to said digital input terminal section and to said digital output terminal section for selecting whether signals transmitted between the plurality of field programmable gate arrays are transmitted between said arrays via the wiring control selector section; and an analog universal region connected to said wiring control selector section and including a circuit for converting an analog signal into a digital signal;

wherein said wiring control selector section may change at least one of said field programmable gate arrays to be of different type by controlling the wiring.

20. An emulation system comprising:

a digital input terminal section to which a digital signal is inputted;

a plurality of field programmable gate arrays for verifying logic of the signal inputted to said digital input terminal section;

a digital output terminal section for outputting a signal of which logic has been verified by said field programmable gate arrays;

a wiring control selector section which is connected to said digital input terminal section and to said digital output terminal section for selecting whether signals transmitted between the plurality of field programmable gate arrays are transmitted via the wiring control selector section; and an analog universal region connected to said wiring control selector section and including a circuit for converting an analog signal into a digital signal;

wherein selection of either a signal path formed by passing through a first time division circuit inserted in a circuit for connection from said wiring control selector section to said plurality of field programmable gate arrays and a second time division circuit inserted in a circuit for connection from said plurality of field programmable gate arrays to said wiring control selector section or a signal path not passing through the first and second time division circuits, is carried out by wiring control of said wiring control selection section.

21. An emulation system according to claim 20, wherein said first time division circuit converts a serial signal to a parallel signal, and said second time division circuit converts a parallel signal to a serial signal.

22. An emulation system according to claim 20, wherein said first time division circuit converts a parallel signal to a serial signal, and said second time division circuit converts a serial signal to a parallel signal.

23. An emulation system according to claim 1, further comprising an EXT terminal section for inputting a signal directly to each field programmable gate array.

24. An emulation system unit comprising a plurality of emulation systems each arranged according to claim 1, wherein digital input terminal sections and digital output terminal sections of respective emulation systems are arranged in the same manner as each other, and the output terminal section of the first emulation system is connected to the input terminal section of the second emulation system.

* * * * *